(12) United States Patent
Du

(10) Patent No.: US 8,674,691 B2
(45) Date of Patent: Mar. 18, 2014

(54) SUSCEPTIBILITY WEIGHTED MAGNETIC RESONANCE IMAGING OF VENOUS VASCULATURE

(75) Inventor: Yiping Du, Aurora, CO (US)

(73) Assignee: The Regents of the University of Colorado, Denver, CO (US)

( * ) Notice: Subject to any disclaimer, the term of this patent is extended or adjusted under 35 U.S.C. 154(b) by 628 days.

(21) Appl. No.: 12/863,729

(22) PCT Filed: Jan. 16, 2009

(86) PCT No.: PCT/US2009/031231
§ 371 (c)(1),
(2), (4) Date: Aug. 30, 2010

(87) PCT Pub. No.: WO2009/094304
PCT Pub. Date: Jul. 30, 2009

(65) Prior Publication Data
US 2011/0275926 A1  Nov. 10, 2011

Related U.S. Application Data

(60) Provisional application No. 61/023,011, filed on Jan. 23, 2008.

(51) Int. Cl.
*A61B 5/055* (2006.01)
(52) U.S. Cl.
USPC .......................................... 324/307; 600/410
(58) Field of Classification Search
USPC ................... 324/307, 309; 600/415, 419, 410
See application file for complete search history.

(56) References Cited

U.S. PATENT DOCUMENTS

| 4,796,635 | A |   | 1/1989 | Dumoulin |
| 5,528,144 | A | * | 6/1996 | Gullapalli et al. ............ 324/306 |
| 6,043,654 | A | * | 3/2000 | Liu et al. ........................ 324/309 |
| 6,442,414 | B1 | * | 8/2002 | Watanabe ..................... 600/419 |
| 6,501,272 | B1 |   | 12/2002 | Haacke et al. |
| 7,610,076 | B2 | * | 10/2009 | Riederer et al. .............. 600/415 |
| 2006/0062731 | A1 |   | 3/2006 | Bammer et al. |

OTHER PUBLICATIONS

Barnes et al. "Simultaneous Angiography and Venography Techniques Compared at 7T." 2009, Proc. Intl. Soc. Mag. Reson. Med. 17, p. 1860.*
Du, Y. P. and Jin, Z. (2008), Simultaneous acquisition of MR angiography and venography (MRAV). Magn Reson Med, 59: 954-958. doi: 10.1002/mrm.21581.*

(Continued)

*Primary Examiner* — Melissa Koval
*Assistant Examiner* — Rishi Patel
(74) *Attorney, Agent, or Firm* — Maschoff Brennan

(57) ABSTRACT

Methods, systems, and devices are described for substantially simultaneous acquisition of magnetic resonance angiography (MRA) and magnetic resonance venography (MRV) data. Some embodiments provide susceptibility weighted magnetic resonance imaging of vasculature, including generating a multi-echo pulse sequence having a repetition time, and a first echo and a second echo during the repetition time; acquiring MRA data from at least the first echo; and acquiring MRV data from at least the second echo. The MRA data and/or the MRV data may also be post-processed (e.g., filtered, displayed, etc.). Various embodiments provide additional functionality, including techniques for processing data from an unsampled portion of one echo using sampled data from another echo.

20 Claims, 19 Drawing Sheets

(56) References Cited

OTHER PUBLICATIONS

Ty Bae, K., Park, S.-H., Moon, C.-H., Kim, J.-H., Kaya, D. and Zhao, T. (2010), Dual-echo arteriovenography imaging with 7T MRI. J. Magn. Reson. Imaging, 31: 255-261. doi: 10.1002/jmri.22019.*

Barnes et al. "Susceptibility Weighted Imaging: Clinical Angiographic Applications." Feb. 2009. Magn Reson Imaging Clin N Am. pp. 1-26.*

International Application No. PCT/US2009/031231, International Search Report and Written Opinion, 8 pages, Aug. 12, 2009.

* cited by examiner

View-Sharing I (only in ky domain, 4-echo):

(a)          (b)

SUSCEPTIBILITY WEIGHTED MAGNETIC RESONANCE IMAGING OF VENOUS VASCULATURE

CROSS-REFERENCES TO RELATED APPLICATIONS

The application claims the benefit of U.S. Provisional Application No. 61/023,011, filed Jan. 23, 2008, entitled "Susceptibility Weighted Magnetic Resonance Imaging of Venous Vasculature," the contents of which is herein incorporated by reference in its entirety for all purposes.

BACKGROUND

This application relates generally to magnetic resonance (MR) imaging. More specifically, this application relates to magnetic resonance angiography and venography.

Currently, MR data for the imaging of arterial and venous vasculature may be acquired in separate scans. Specifically, MR angiography (MRA) may be used to acquire arterial vasculature data, and MR venography (MRV) may be used to acquire venous vasculature data. The time to perform either a MRA or a MRV scan may be relatively long (e.g., approximately 10-20 minutes). These long scan times may cause patient discomfort, errors in data acquisition due to patient movement, and other issues.

MRA and MRV may, among other things, reveal different neuronal and vascular abnormalities and provide complementary diagnostic assessments of brain diseases. For example, MRA may depict the feeding vessels of a tumor, and MRV may identify the draining veins of the tumor. However, while each of MRA and MRV scans may provide its own clinical significance, performing both scans may significantly increase the scan time for a given subject (e.g., a patient). The increased scan time for undergoing both MRA and MRV scans can exacerbate issues with patient discomfort and acquisition errors, especially when large volume coverage and/or high resolutions are required. These and other issues may adversely affect the use of both MRA and MRV in a routine clinical exam.

As such, it may be desirable to provide new approaches to the substantially simultaneous acquisition of both MRA and MRV data in a single scan session.

BRIEF SUMMARY

Among other things, embodiments of the invention include methods, systems, devices, and software for providing substantially simultaneous acquisition of both MRA and MRV data in a single scan session.

In one embodiment, an MR imaging device (e.g., an MRI machine) is used to scan a patient's brain to look for abnormalities. A multi-echo pulse sequence is used to generate multiple echoes from which data may be gathered. Some echoes may be used to acquire MRA data and others may be used to acquire MRV data, all within each repetition time of the imaging device. The data may then be post-processed to generate useful information, for example, for diagnosis. The post-processing may include filtering (e.g., using susceptibility weighting and/or other techniques) and display.

In one set of embodiments, a system for susceptibility weighted magnetic resonance imaging of vasculature is provided. The system includes a magnetic resonance device. The magnetic resonance device has a pulse generator module configured to generate a multi-echo pulse sequence having a repetition time; and a first echo and second echo during the repetition time; and a data acquirer module, communicatively coupled with the pulse generator module and configured to acquire MRA data from at least the first echo and MRV data from at least the second echo. In some embodiments, the system also includes a post-processor module, communicatively coupled with the magnetic resonance device and configured to post-process at least one of the MRA data or the MRV data. In other embodiments, the system also includes a display generator module, communicatively coupled with the post-processor module and configured to display at least one of the MRA data and the MRV data.

In another set of embodiments, a method for susceptibility weighted magnetic resonance imaging of vasculature is provided. The method includes generating a multi-echo pulse sequence having a repetition time, and a first echo and a second echo during the repetition time; acquiring MRA data from at least the first echo; and acquiring MRV data from at least the second echo. In some embodiments, the method also includes post-processing at least one of the MRA data and the MRV data. In other embodiments, the method further includes displaying both of the MRA data and the MRV data at substantially the same time. In still other embodiments, the method also includes processing data from an unsampled portion of one echo using sampled data from another echo.

In yet another set of embodiments, a method for multi-slab data acquisition using susceptibility weighted magnetic resonance imaging is provided. The method includes generating a multi-echo pulse sequence comprising a first excitation signal having a first repetition time duration until a first echo signal can be received, and a second excitation signal having a second repetition time duration until a second echo signal can be received; directing the first excitation signal to excite a first slab of a target; directing the second excitation signal to excite a second slab of a target during the first repetition time duration; acquiring first slab data at least by receiving the first echo signal during the second repetition time duration; and acquiring second slab data at least by receiving the second echo signal substantially at the end of the second repetition time duration.

In still another set of embodiments, another method for multi-slab data acquisition using susceptibility weighted magnetic resonance imaging is provided. The method includes generating a multi-echo pulse sequence having: a first excitation signal having a first repetition time duration until a first echo signal can be received and a second repetition time duration until a second echo signal can be received; and a second excitation signal having a third repetition time duration until a third echo signal can be received and a fourth repetition time duration until a fourth echo signal can be received; directing the first excitation signal to excite a first slab of a target; directing the second excitation signal to excite a second slab of a target after expiration of the first repetition time duration and during the second repetition time duration; acquiring MRA data from the first slab substantially at the end of the first repetition time duration; acquiring MRV data from the first slab substantially at the end of the second repetition time duration; acquiring MRA data from the second slab substantially at the end of the third repetition time duration; and acquiring MRV data from the second slab substantially at the end of the fourth repetition time duration.

And in another set of embodiments, a method for post-processing magnetic resonance imaging data is provided. The method includes receiving MRA and MRV data; weighting the MRA and MRV data using a susceptibility weighting algorithm; filtering the MRA and MRV data using a filtering algorithm; and projecting the MRA and MRV data using a projection algorithm.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. Labels and illustrations depicting singular components are intended to illustrate also embodiments comprising a plurality of some or all of those components.

FIG. 16a provides a histogram of local field gradients in the entire brain volume covered in a slab.

FIG. 16b provides profiles of various Fermi weighting functions performed on the data shown in FIG. 16a.

DETAILED DESCRIPTION OF EMBODIMENTS

Figure 1:
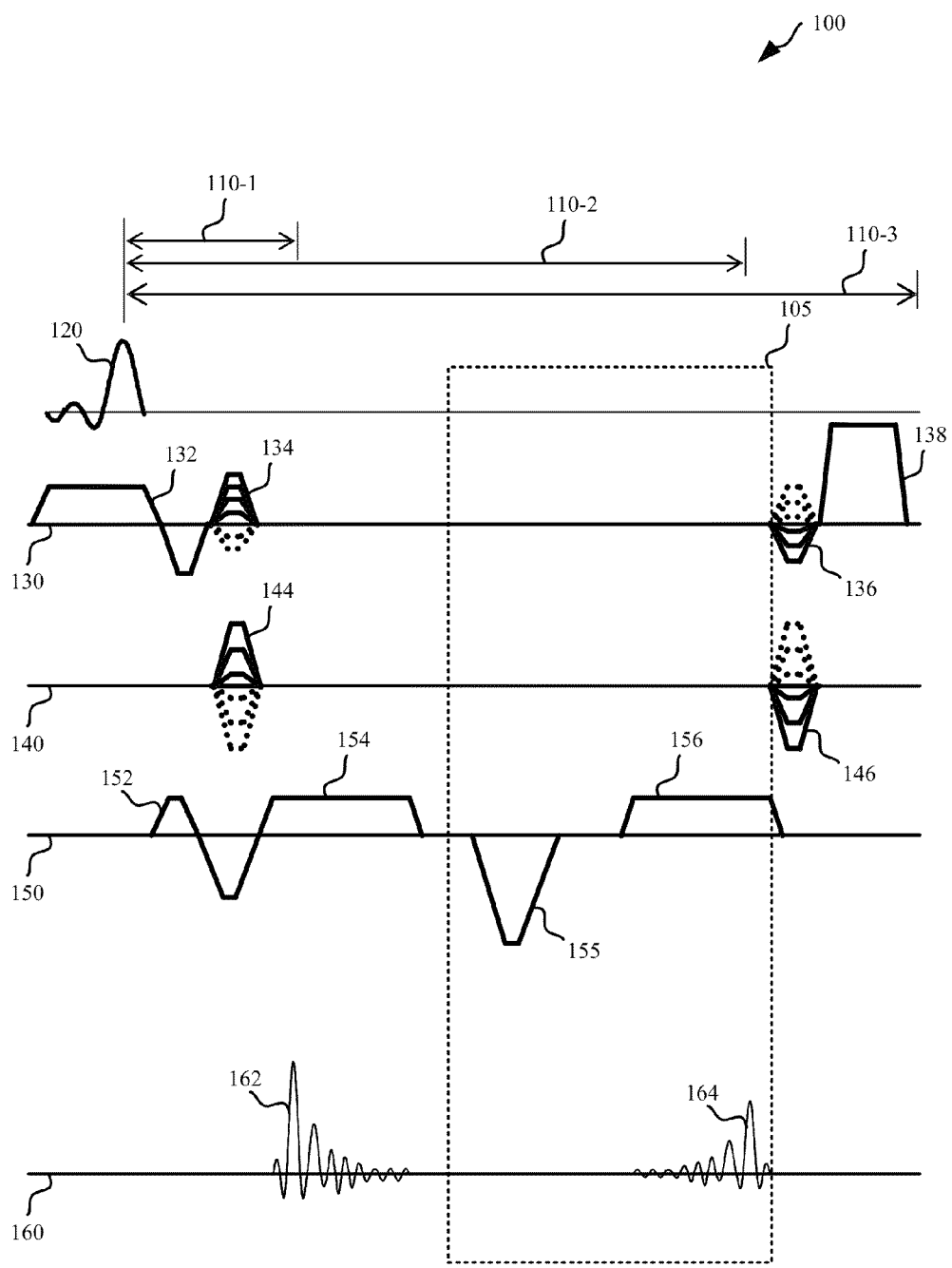
FIG. 1 provides an illustration of an exemplary dual-echo pulse sequence according to embodiments of the invention.

Embodiments of the invention relate to imaging of arterial and venous vasculature using susceptibility-weighted magnetic resonance angiography (MRA) and magnetic resonance venography (MRV). Some embodiments use a multi-echo approach to acquire both MRA and MRV data in a substantially simultaneous fashion. The MRV data may be acquired with one or more echoes. Some embodiments present a weighting function using the measurement of local field gradients to reduce off-resonance artifact. Other embodiments provide an image-domain high-pass filter to obtain MRV with positive contrast of the veins, reduce off-resonance artifact, and enhance the visibility of venous vasculature. Some of these embodiments utilize maximum intensity projection (MIP) algorithms, while others utilize modified minimum intensity projection (mIP) algorithms. Still other embodiments provide for the substantially simultaneous display of both arterial and venous vasculature data from the MRA and MRV data acquisitions. Even other embodiments use local field gradient maps and novel weighting functions to reduce artifacts in Susceptibility-Weighted Imaging (SWI) data.

Data Acquisition

In conventional MRA, optimal balance between the inflow effect and background suppression is obtained by proper selection of repetition time (TR). The TR may include both an active period (e.g., during which various pulses are played out to excite the magnetization, encode the magnetization, and to sample the MRI signal) and a dormant period (e.g., during which the magnetization is allowed to relax). The dormant period may be used in various ways, including, for example, as time for the sample to relax after excitation from the active period of the pulse sequence, as time for the magnetization to return to an equilibrium state, and as time to allow fresh blood to flow into the imaging volume.

In some embodiments, the TR for a three-dimensional time-of-flight (3D TOF) MRA pulse sequence may be approximately 25-50 milliseconds for a three Tesla scan. The active period for the 3D TOF pulse sequence may have a duration of around 10-15 milliseconds, including excitation, phase encoding, data acquisition, phase rewinding, and gradient spoiling portions of the pulse sequence. It is worth noting that an active period of even 15 milliseconds may leave a dormant period of up to 35 milliseconds in a 50 millisecond TR. As such, there may be considerable idle time during each repetition due to the duration of the dormant period.

During this idle time in the MRA pulse sequence, it may be possible to acquire MRV data. Some reasons relate to the similarities between the data acquisitions in MRA and MRV scans. For example, both acquisitions may use a three-dimensional spoiled gradient-recalled echo (SPGR) pulse sequence. Further, the signals used in MRA and MRV scans may both require flow compensation. Other reasons relate to the differences between the data acquisitions in MRA and MRV scans. For example, MRA may use a short TE (e.g., around 3-5 milliseconds) to reduce high-order flow artifacts, while MRV may use a relatively long TE to reach out-of-phase partial volume signal cancellation between venous blood and background tissue in the same voxel. The longer TE in MRV scans may, for example, improve venous contrast. In one embodiment, venous blood that is substantially parallel to the main magnetic field is out of phase with the venous parenchyma when using a TE of approximately 28 milliseconds at 3 Tesla (similar results may be predicted using a cylinder model of venous blood).

In one embodiment, a pulse sequence is used to generate multiple echoes, one with a short TE and others with longer TEs. Using the multi-echo pulse sequence, MRA data is acquired during the first echo, and MRV data is acquired during the second echo and subsequent echoes. The MRV data and the MRA data can be acquired in contemporaneous scan. In this way, the TR and/or the total scan time may be approximately equivalent to those experienced during conventional MRA scans. As an example, a dual-echo pulse sequence is used to acquire MRA data in the first echo and MRV data in the second echo.

Turning to FIG. 1, an illustration of an exemplary dual-echo pulse sequence is provided. The pulse sequence 100 may include radio-frequency excitation pulses 120, pulses in the slice selection direction 130, pulses in the phase-encoding direction 140, and pulses in the readout direction 150. For illustrative purposes, exemplary signal responses 160 are also shown on the same time scale.

In some embodiments, the pulse sequence 100 is a modified 3D TOF pulse sequence 100. At times, a conventional 3D TOF pulse sequence 100 may be used in an MRA scan for multiple overlapped thin slab acquisition. The conventional 3D TOF pulse sequence 100 may allow for a first echo acquisition 162 after a first TE 110-1.

In certain embodiments, the conventional 3D TOF pulse sequence 100 is modified to acquire data during a second echo time 105. During this second echo time 105, a second echo acquisition 164 may be performed after a second TE 110-2. The second echo acquisition 164 may include either a full or a partial echo. For example, a partial second echo acquisition 164 may allow a shortened total TR 110-3.

In some embodiments, a fly-back gradient 155 is used. The fly-back gradient 155 may cause readout from a second gradient 156 to have the same polarity as readout from a first gradient 154. The fly-back gradient 155 may be placed in the middle of two readouts to restore flow-compensation along the readout direction 150 in the second echo time 105. The fly-back gradient 155 may also refocus the second echo acquisition 164.

In some embodiments, flow compensation (e.g., 134 and 152) is applied in the slice selection direction 130 and in the readout direction 150 (e.g., to reduce flow artifacts in both echoes). Flow compensation may also be applied in the slice selection direction 130 and in the phase-encoding direction 140 (not shown in FIG. 1). In other embodiments, phase rewinders (e.g., 136 and 146) are applied in the slice selection direction 130 and in the phase-encoding direction 140. In still other embodiments, a spoiler 138 is applied to destroy residual transverse magnetization.

In one embodiment, MRA and MRV data of a healthy subject are acquired using a dual-echo pulse sequence. The data may be acquired on a General Electric three Tesla scanner at standard and high resolutions with a standard birdcage head coil. Both scans may have a rectangular field-of-view (FOV) of approximately 20-by-16 centimeters, a slice thickness of approximately 1.6 millimeters, and a flip angle of approximately 20 degrees. A second echo TE of approximately 24.5 milliseconds may be selected for near maximal phase cancellation between the veins and parenchyma at the three-Tesla field strength of the scan. A minimum TR of 32 milliseconds (e.g., limited by the readout gradient timing and the spoiling gradient timings) may be chosen to reduce the scan time. A relatively low bandwidth of approximately ±15.6 kilohertz may be used in the readout to ensure a sufficient signal-to-noise ratio in the MRV data. Two slabs with 32 slices per slab may be acquired. Other components may be added to the system to improve the data acquisition. For example, a high-order autoshim may be applied prior to the scans to improve field inhomogeneity (e.g., the B0 field inhomogeneity).

It will be appreciated that different parameters may be used to affect the resolution of the MRA and MRV data acquisition. In one embodiment, the MRA and MRV scans may acquire data at one resolution. Each slab may have a matrix size of 256-by-208-by-32 voxels and an in-plane resolution of 0.781-by-0.781 millimeters$^2$. The voxel volume may be 0.98 millimeters$^3$. A 68.7% partial echo may be used to reduce the TE of the first echo 110-1 to approximately 3.1 milliseconds and to maximize the second echo TE 110-2. Using these parameters, the total imaging time may be approximately 7 minutes and 17 seconds for the acquisition of data at the standard resolution.

In another embodiment, higher resolution MRA and MRV data are acquired. Each slab may have a matrix size of 384-by-312-by-32 voxels, at the same rectangular FOV. The in-plane resolution may be 0.52-by-0.52 millimeters$^2$, and the voxel volume may be 0.43 millimeters$^3$. These voxel dimensions may be consistent with optimal dimensions for three-Tesla MRA scans. A 66.7% partial echo may be used to reduce the TE of the first echo 110-1 to approximately 4.1 milliseconds. Using these parameters, the total imaging time may be approximately 10 minutes and 46 seconds at this higher resolution.

Figure 2:
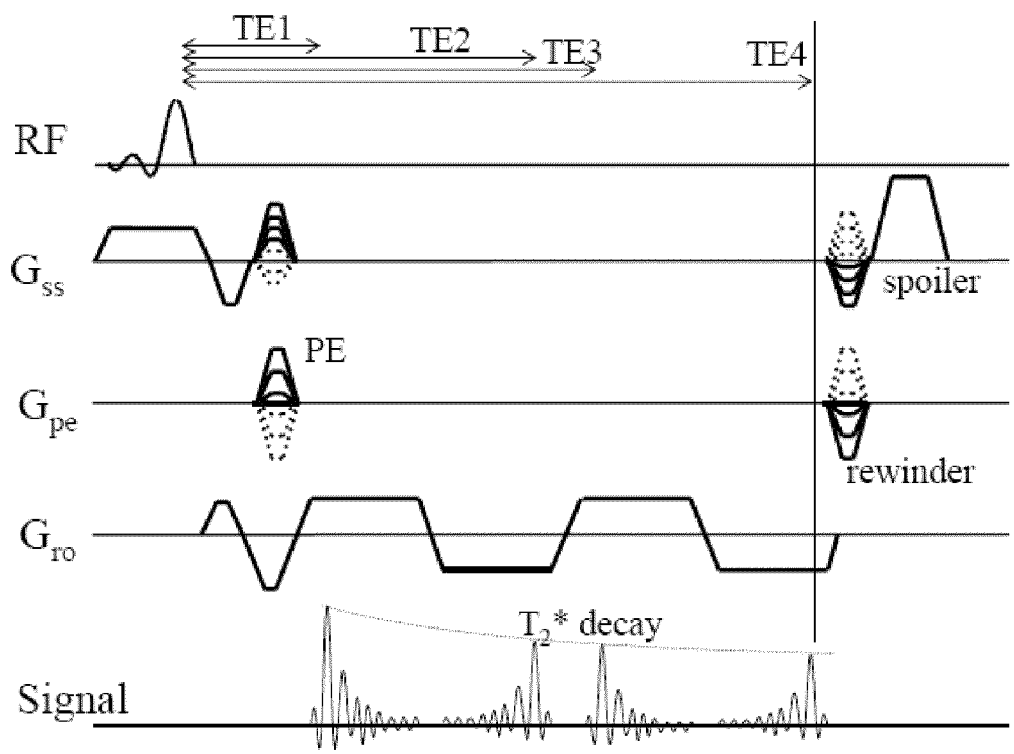
FIG. 2 provides an exemplary embodiment of a multi-echo pulse sequence according to the invention.
Figure 3:
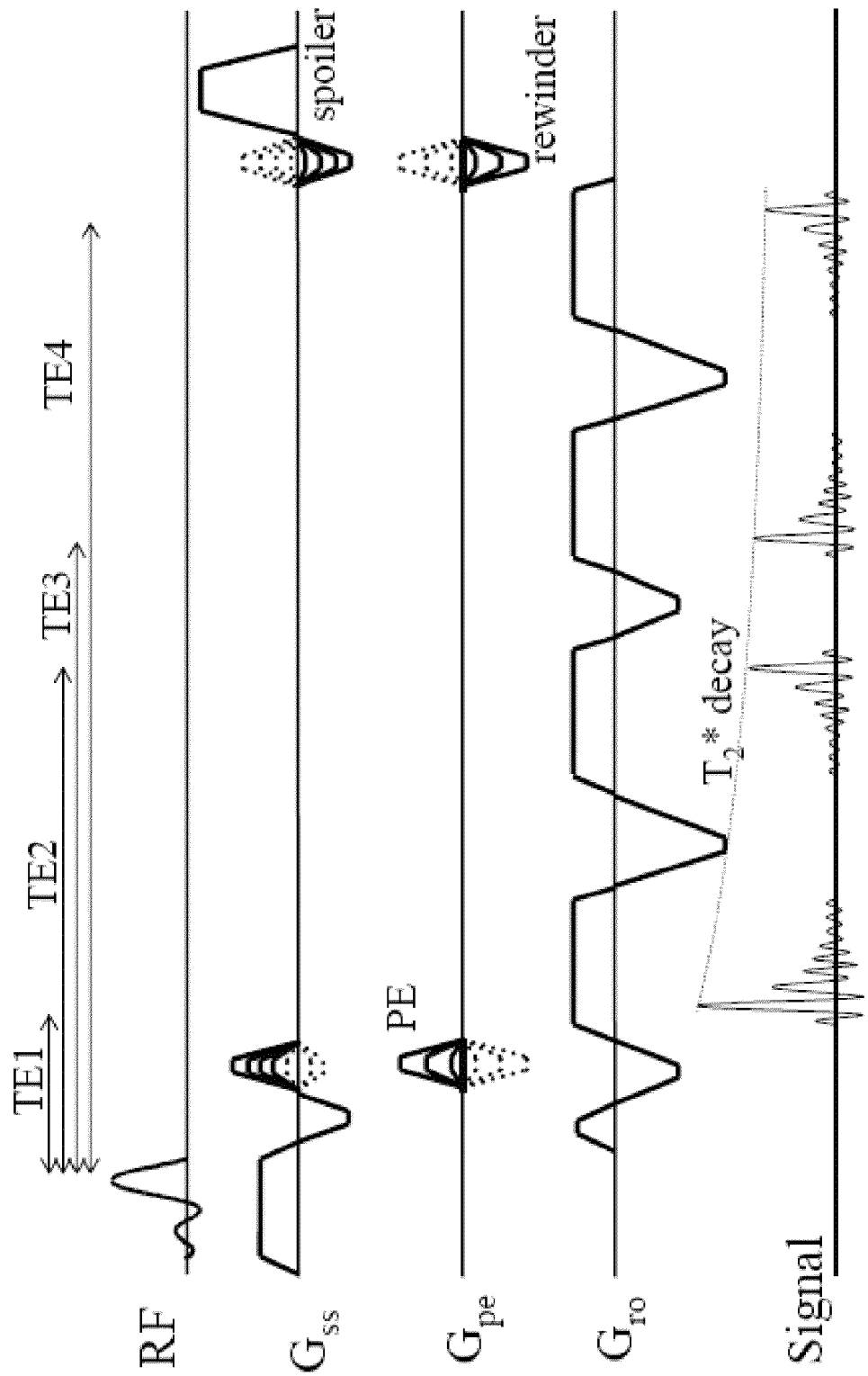
FIG. 3 provides another embodiment of a multi-echo pulse sequence according to the invention.

While the above embodiments described approaches that utilize two echoes, other embodiments utilize more than two echoes. FIG. 2 provides an exemplary embodiment of a multi-echo pulse sequence according to the invention. Four echoes are acquired. The first echo (having a short TE) is acquired for the imaging of the arterial vasculature, and the second and subsequent echoes (having longer TEs) are acquired for the imaging of the venous vasculature. FIG. 3 provides another embodiment of a multi-echo pulse sequence, similar to the one in FIG. 2, but using fly-back gradients to refocus the echoes without compromising flow-compensation.

It will be appreciated that multiple echoes may be acquired and used in a number of different ways. In some embodiments, subsequent echoes may be used to improve image quality. For example, SWI data acquired in the second and later echoes can be combined to form composite susceptibility-weighted images to increase signal-to-noise ratio (SNR) and the visibility of veins compared to the images acquired at each individual echo. For example, the squared-root-of-squared-sum of phase masks at different echoes may form a composite phase mask, the squared-root-of-squared-sum of the magnitude images at different echoes may form composite magnitude images. The composite phase mask may have a higher SNR than the phase mask at each individual echo; the composite magnitude images may have a higher SNR than the magnitude images acquired at each individual echo.

In other embodiments, the sampled data in one echo may be used to fill in unsampled data in other echoes (described in more detail below). In yet other embodiments, the echoes may be used as part of an interleaving approach to simultaneous data collection on multiple slabs.

The signal intensity is reduced in later echoes due to T2* decay. Echo-sharing may introduce artifact, such blurring along the frequency encoding direction, due to the discontinuity of intensity between the sampled part of the echo and shared part of the echo. Compensation may be applied to reduce this artifact. The sampled data in Echo 2 is multiplied by $\exp(\tau 12)$ before being used to fill in the unsampled data in Echo 1, where $\tau 12$ is the time interval between the sampled data in Echo 2 and unsampled data in Echo 1; the sampled data in Echo 2 is multiplied by $\exp(-\tau 23)$ before being used to fill in unsampled data in Echo 3, where $\tau 23$ is the time interval between the sampled data in Echo 2 and unsampled data in Echo 3; the sampled data in Echo 3 is multiplied by $\exp(\tau 23)$ before being used to fill in the unsampled data in Echo 2; the sampled data in Echo 3 is multiplied by $\exp(-\tau 34)$ before being used to fill in the unsampled data in Echo 4, where $\tau 34$ is the time interval between the sampled data in Echo 3 and unsampled data in Echo 4.

Figure 21:
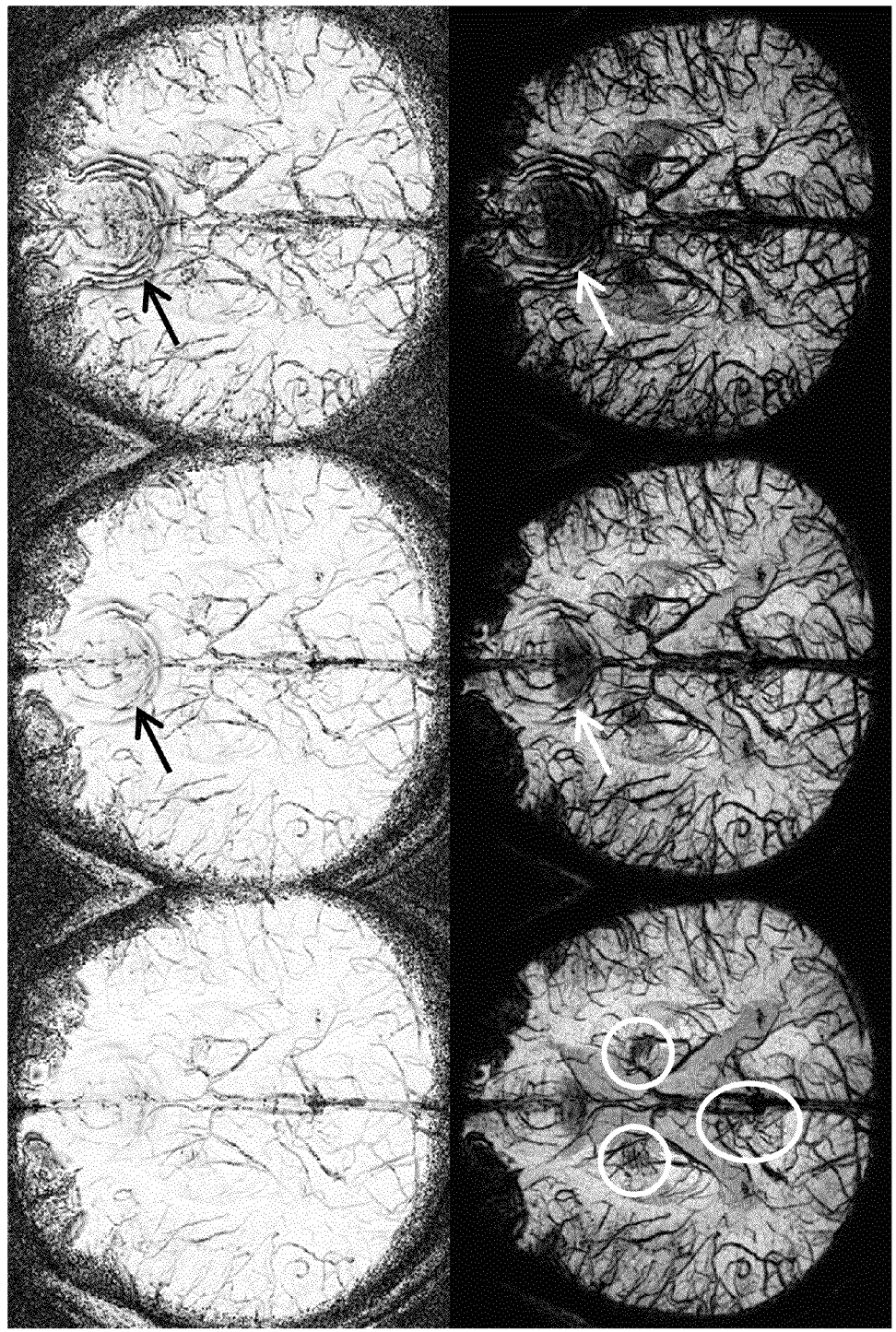
FIG. 21 provides an exemplary illustration of the mIP for phase masks and magnitude images of various echoes.

FIG. 21 provides an exemplary illustration of the mIP for phase masks and magnitude images of various echoes. The top row shows the mIP of the phase masks, and the bottom row shows the magnitude images. The leftmost column shows data from a second echo (TE=19.7 ms); the middle column shows data from a third echo (TE=23.4 ms); and the rightmost column shows data from a fourth echo (TE=37.6 ms). The first echo was acquired for MR angiography (not shown in this figure). The regional susceptibility effect at the orbito-frontal cortex introduces artifact in the phase mask and SWI, as indicated by the arrows. The veins in several regions are better visualized at a short TE, as indicated by the circles and ellipse.

Data Post-Processing

One source of post-processing issues may arise from the separate acquisition of MRA and MRV data. One issue is that the venous vasculature data may be difficult to register in the same three-dimensional space as the arterial vasculature data, when generated separately. Another issue is that even small movements of the scan subject may cause shifts in data points, which may cause data acquisition errors and other artifacts.

Embodiments of the invention use substantially simultaneous acquisition of MRA and MRV data to mitigate these issues. Because both the MRA and MRV data are acquired during a single TR period, issues relating to three-dimensional reference set registration and inter-scan subject movement may be significantly reduced. One result may be the potential elimination of issues relating to misregistration between arterial and venous vasculature data. Another result may be the possibility for precise simultaneous display of overlaid MRA and MRV datasets (e.g., to identify the exact spatial relationship between the arterial and venous vasculatures at or near lesions, or for certain interventional or stereotactic procedures).

Another source of post-processing issues may be conventional post-processing procedures for SWI. In conventional SWI of venous vasculature, a three-dimensional phase mask may be constructed using k-space based, high-pass filtered phase images. The phase mask may be multiplied with the original three-dimensional magnitude image several times to generate sufficient venous contrast. The venous vasculature may then be displayed using minimum-intensity projection (mIP). One issue with this approach is that veins in regions of severe B0 field inhomogeneity may not be detectable and/or visible. Another issue is that venous segments in some of the peripheral regions of the scan may become lost during the mIP display. Still another issue is that the visibility of small veins may be reduced when mIP is applied to a thick slab.

SNR is one issue which may continue to be present in MRV data acquisition at high spatial resolutions, even at three-Tesla. However, the SNR in MRV may be lower than that in MRA, partly because of the longer TE for MRV. For example, averaged SNR in the MRV data may be about 35% lower than that in the MRA data due to T2* decay (i.e., decay due to a loss of phase coherence in the transverse plane). Various other aspects of the scans, particularly the MRV scans, may also impact the SNR. For example, venous blood may have a lower SNR than stationary tissue due to its negative contrast. In another example, applying multiple multiplications of the phase mask to the original dataset may introduce extra noise from the phase mask into the final images. For yet another example, reducing readout bandwidth may be effective in increasing the SNR of MRV data without introducing major flow artifacts arising from the veins, due to the slow flow rate and lack of pulsation in the venous flow. For still another example, excluding part of the high-frequency data in k-space, such as the data at the corners in k-space, during the reconstruction of MRV may also increase SNR (however, this technique may reduce spatial resolution).

It will be appreciated that many post-processing approaches may be used to mitigate issues with using scan data. These post-processing approaches may include filtering, multiplying, interpolating, projection, masking, and any other useful data processing algorithms. Post-processing may be performed concurrently with data acquisition (e.g., some post-processing of certain data may begin while other data is being collected) or after data collection is complete.

In one embodiment, an image-domain high-pass filter is used for enhancing the visibility of venous vasculature. Second-order phase difference (SPD) in each voxel (x, y, z) of a three-dimensional SWI complex dataset may be calculated along multiple discrete directions. Image-domain high-pass filters may be constructed using different combinations of SPDs at different directions. These digital filters may provide a positive (or negative) contrast to the voxels that are fully or partially occupied by veins. For example, prior to filtering, voxels that are fully or partially occupied by veins may have a lower phase and smaller magnitude than neighboring voxels in stationary tissue. Implementation of the filter in this embodiment may include using the alpha'th power of the squared-sum of SPDs along the x, y, and z directions, where alpha is a parameter that provides optimal venous contrast. In other embodiments, other filters (e.g., cross-sectional filter, maximum-minimum second-order difference filter, and long range cross-sectional filters) may be modified to enhance the phase in voxels that are fully or partially occupied by veins. The filtered dataset may then be used to provide a positive venous contrast.

In certain embodiments, maximum intensity projection (MIP) is used to display the venous vasculature that has a positive venous contrast (e.g., venous vasculature is highlighted on a dark background). With the MIP display, background intensity may be nearly zero, highlighting only the venous vasculature. Using MIP display may allow visualization of venous vasculature with positive contrast. Additionally, MIP may mitigate certain post-processing issues by improving detection and display of venous vasculature in regions with high B0 field inhomogeneity, detection and display of venous vasculature in peripheral regions of the scans, and display of the MIP projection in a thick volume.

In other embodiments, the filtered 3D dataset is multiplied with the original 3D magnitude image, which may provide negative venous contrast (e.g., venous vasculature is represented by darkened regions of a bright background). In these embodiments, a mIP may be used to display the venous structure. Modified mIP algorithms may be used, in which the voxels outside the brain are excluded during mIP, to improve detection and display of venous vasculature in certain peripheral regions of the scan (which may be undetectable using conventional mIP algorithms).

In one embodiment, image reconstruction and post-processing are performed using data processing software. The iterative projection onto convex sets (POCS) algorithm and/or zero padding may be applied to one or two or three directions in undersampled k-space data.

In another embodiment, MRA data is obtained by taking the magnitude of the 3D images reconstructed from a first echo. Four slices on the top and bottom of each slab may be removed to reduce the artifacts introduced by signal wrap-around along the slice direction. Two slabs of the MRA data may then be concatenated with four slices overlapped at the boundary. Three-dimensional complex MRV images may also be reconstructed, by using data acquired at the second echo. A three-dimensional phase mask may be constructed from the complex MRV images for each slab to enhance the venous contrast and remove incidental phase variations due to static magnetic field inhomogeneity effects.

In various embodiments, data may be post-processed in any or all of a number of ways. In one embodiment, a symmetric two-dimensional Hamming window may be applied to the two-dimensional k-space data from each slice. For example, filter sizes of 96-by-72 for standard resolution and 128-by-96 for high resolution may yield sufficiently homogeneous phase images while preserving the phase changes in the venous vasculature. In another embodiment, original complex images may be divided by low-pass filtered complex images. The resulting high-pass filtered complex images may then be used to construct a three-dimensional phase mask. The three-dimensional phase mask may set all phase values above a threshold of zero degrees to unity, while linearly scaling all phase values below the threshold and larger than negative-It to between zero and unity. In certain embodiments, the magnitude MRV images may then be multiplied by the three-dimensional phase mask (e.g., four times) to enhance the visibility of venous vasculature. Slices on the top and bottom of each slab may be removed to reduce wrap-around artifacts. In one embodiment, a venogram is then generated by performing a mIP in each slab along the slice direction.

In some embodiments, artifacts in SWI data may be reduced by using local field gradients (LFGs) to assess local field inhomogeneities. In certain embodiments, the LFGs may be used in a weighting function to generate LFG-suppressed images. In one embodiment, the weighting function is a novel Fermi weighting function of the form:

$$Fermi(LFG) = \frac{1}{1 + e^{(LFG-R)/W}},$$

where the magnitude of the LFG is given by:

$$LFG(r) = \sqrt{LFG_x^2(r) + LFG_y^2(r) + LFG_z^2(r)}.$$

Figure 4:
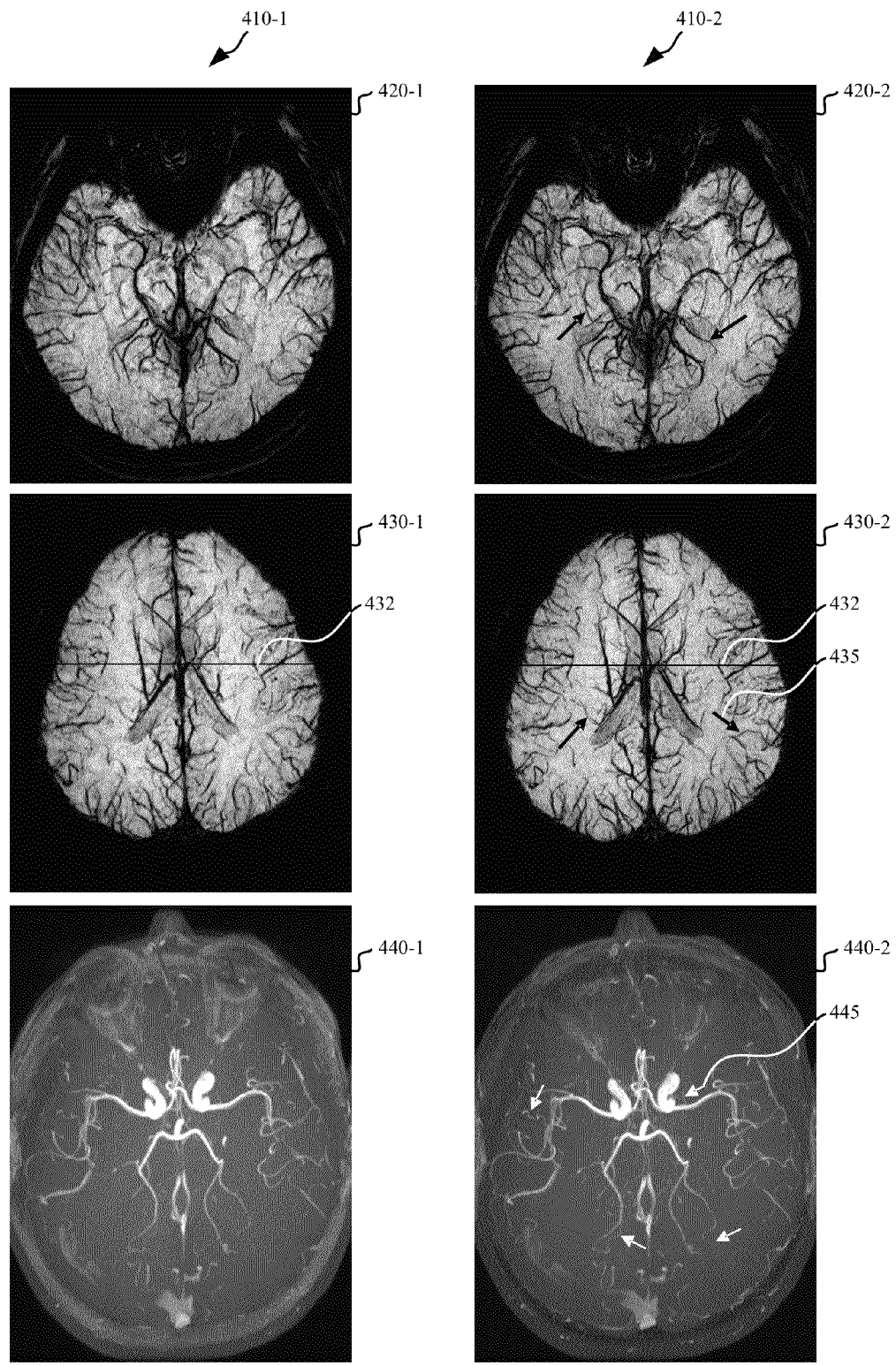
FIG. 4 provides illustrative projections of both regular resolution and high resolution output of MRA and MRV scans according to embodiments of the invention.

An illustration of some other post-processing techniques is provided in FIG. 4, which shows both standard resolution and high resolution output of MRA and MRV scans. The left column 410-1 of images shows standard resolution (e.g., 256×208) data, and the right column 410-2 of images shows high resolution (e.g., 384×312) data. The top row 420 shows a mIP of MRV data from 32 interpolated slices in an inferior slab with a thickness of 25.6 millimeters. The middle row 430 shows a mIP of MRV data for 40 interpolated slices in a superior slab with a thickness of 32.0 millimeters. The bottom row 440 shows a MIP of MRA data from the concatenated slabs.

In FIG. 4, venous contrast is higher with the high resolution 410-2 acquisition compared to that with the regular resolution 410-1. For example, black arrows 435 in the high resolution MRV mIP image 430-2 point to certain veins which are more clearly visible when using a higher resolution. Further, small arteries may be better depicted in the high resolution MRA. For example, white arrows 445 point to certain higher visibility arteries in the high-resolution MRA image 440-2.

Figure 5:
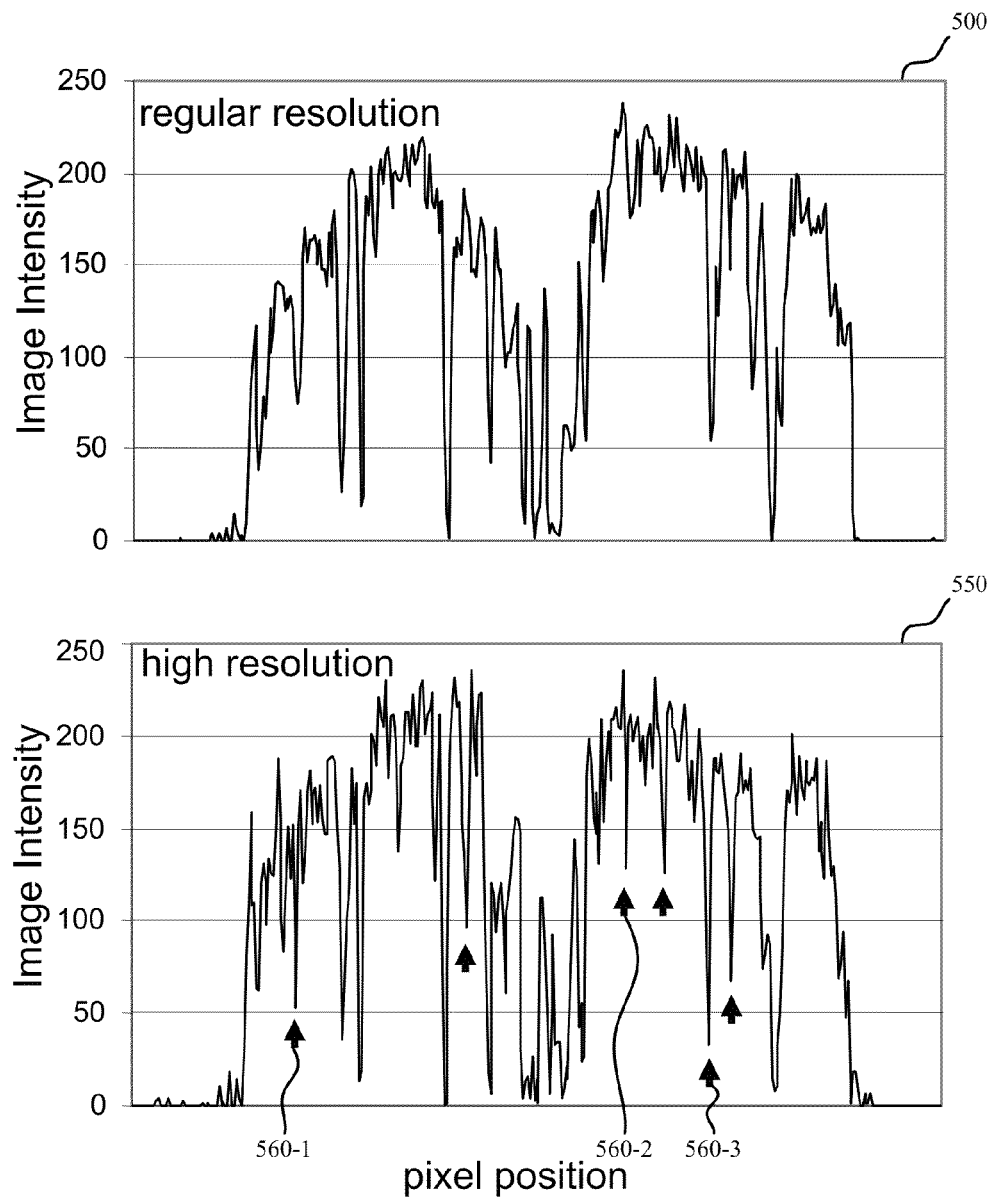
FIG. 5 provides illustrative image intensity profiles of MRV data shown in FIG. 4 according to embodiments of the invention.

It may be instructive to analyze intensity profiles for images of scan data to compare similar pixel regions in multiple images. The image intensity profiles may include two-dimensional plots of image intensities as a function of pixel position. FIG. 5 provides exemplary image intensity profiles of the black line 432 passing from right to left through the center of each of the middle row images 430 shown in FIG. 4.

The image intensity profile of the standard (or regular) resolution MRV 500 and the image intensity profile of the high resolution MRV 550 are shown. In certain areas, the image intensity profiles show higher venous contrast at the high resolution MRV in certain vessel segments. For example, the short arrows 560 identify areas where there is an increased number and amplitude of downward peaks, which may reflect higher venous contrast.

Figure 6:
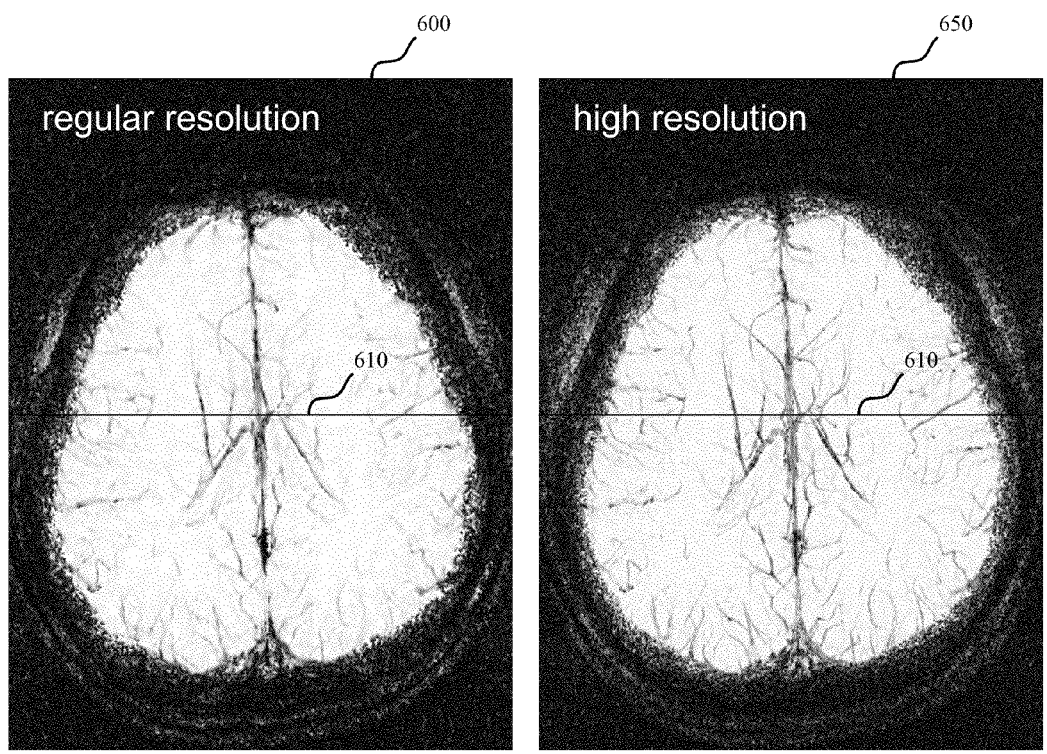
FIG. 6 provides an illustrative minimum intensity projection (mIP) of a three-dimensional phase mask of a superior slab according to embodiments of the invention.

To further improve the venous contrast in the MRV images from the middle column of FIG. 4, some embodiments may apply a three-dimensional phase mask. Images illustrating the phase mask values for the mIP MRV data are shown in FIG. 6. Specifically, FIG. 6 shows the mIP of the 3D phase mask of the superior slab data with a standard (or regular) resolution image 600 and a high resolution image 650.

Figure 7:
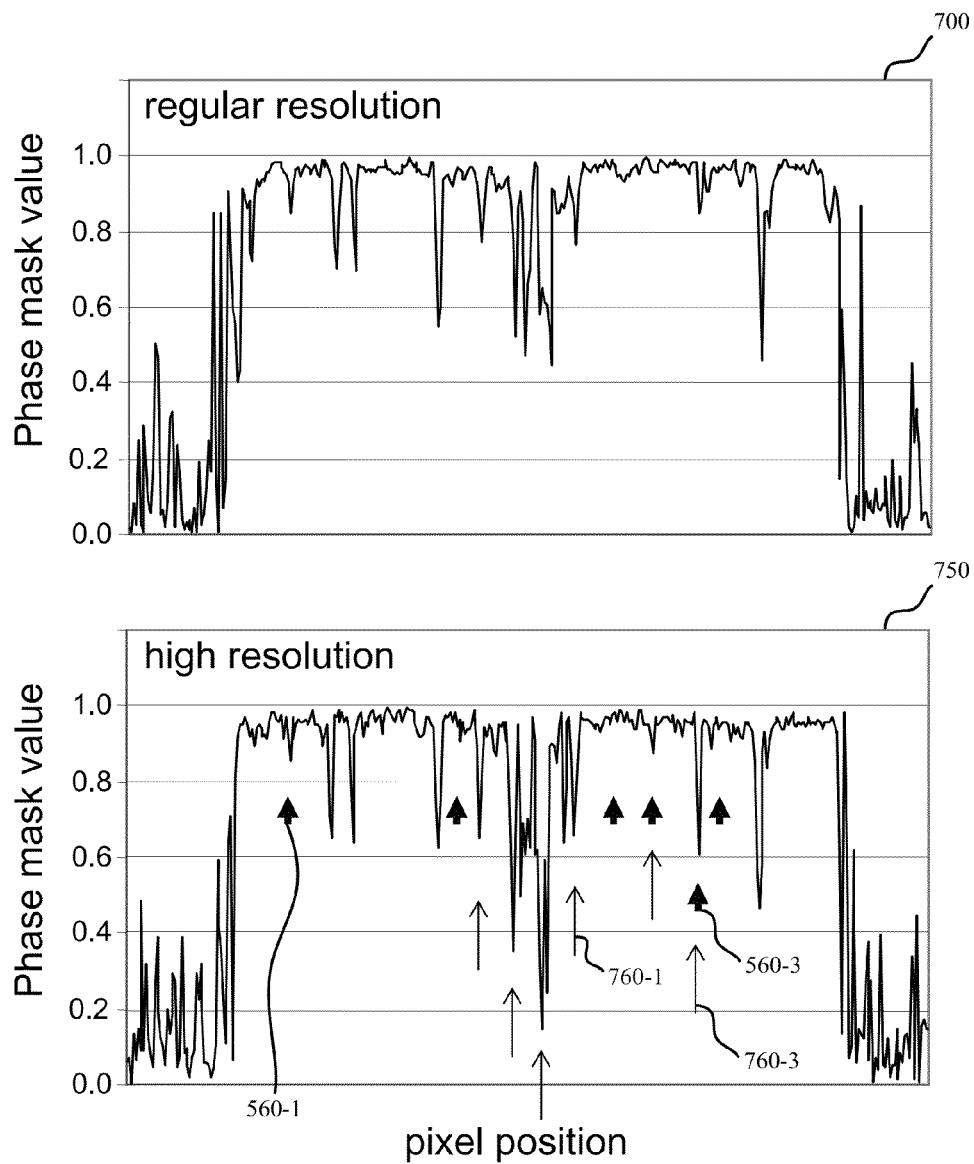
FIG. 7 provides illustrative image intensity profiles of mIP data shown in FIG. 6 according to embodiments of the invention.

The phase contrast of small veins may be substantially higher in the high resolution image 650 than that in the standard resolution image 600 after applying the phase mask. To more clearly identify areas of higher venous contrast, image intensity profiles may be used. FIG. 7 provides exemplary image intensity profiles of the black lines 610 passing from right to left through the center of each of the images (600 and 650) shown in FIG. 6. It is worth noting that the location of the black line 610 shown in FIG. 6 is the same as the black line 432 shown in FIG. 4.

In FIG. 7, an exemplary standard resolution image intensity profile 700 and an exemplary high resolution image intensity profile 750 are shown. Veins located in pixel regions indicated by thin arrows 760 have higher contrast at high resolution than that at standard resolution. Short arrows 560 mark the same pixel locations as the short arrows 560 shown in FIG. 5. Some locations marked with the short arrows may overlap with locations marked by thin arrows (e.g., short arrow 560-3 and thin arrow 760-3), while others may not (e.g., short arrow 560-1 and thin arrow 760-1). It will now be appreciated that the additional arrow locations representing improved venous contrast at high resolution may arise from improved contrast in both phase and magnitude images.

In some embodiments, voxel aspect ratio may further enhance venous contrast of MRV data. In one embodiment, optimal venous contrast of a vein perpendicular to the main field is achieved using an aspect ratio of R/w/h=1:1:4, where R is the diameter of the vein, and w and h are the width and height of the voxel dimension. In another embodiment, maximum venous contrast for transverse acquisitions of small veins (e.g., 0.5 millimeters) is achieved by using an in-plane resolution of 0.5 mm-by-0.5 mm with a slice thickness of 2 millimeters. This voxel aspect ratio may be larger than that typically used in MRA, in which thinner slices may be used to preserve the vessel sharpness in projections along non-transverse planes. In still other embodiments, the voxel aspect ratio is 1-to-2.05 in the images with regular resolution and 1-to-3.07 in the images with higher resolution. The higher voxel aspect ratio in higher resolution images may account for improved venous contrast in the MRV data.

In certain embodiments, voxel aspect ratios are altered during image reconstruction. For example, several high frequency views along kz (in the slice direction) may be removed, which may increase the effective slice thickness. Increasing the effective slice thickness may similarly increase the voxel aspect ratio in the MRV images for the enhancement of venous contrast.

Figure 24:
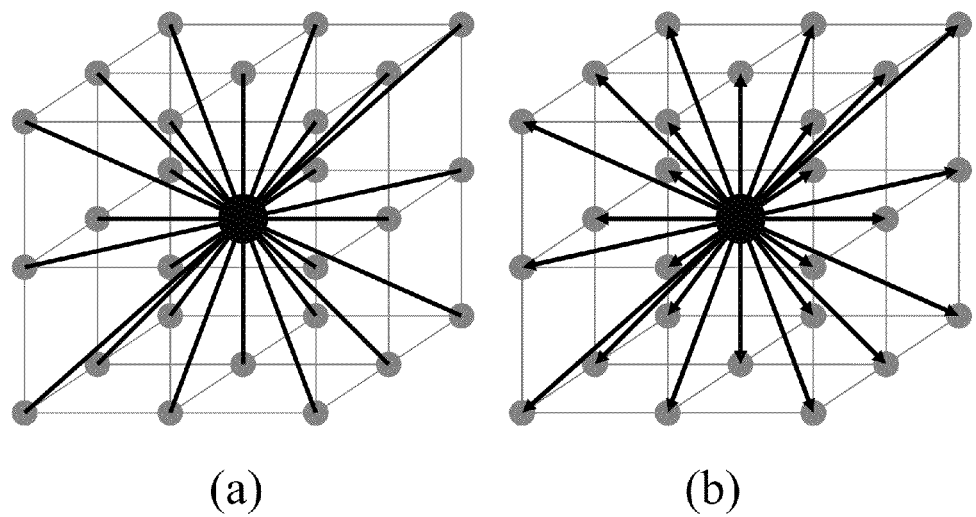
FIGS. 24a and 24b provide an exemplary illustration of a second-order phase difference operator defined in a 3×3×3 kernel.

The cylindrical nature of the veins may provide a unique feature for the enhancement of their visibility in venography. The voxel that contains a vein has a more negative phase than its neighboring voxels that are not occupied by a vein. Viewing the vein on its cross-sectional plane in the phase image may reveal that the venous voxel would have as a "dip" of a phase compared to its neighboring voxels. A second-order phase difference (SPD) operator can be defined in a 3×3×3 kernel:

$$SPD_{ij} = \phi_j(i+1) + \phi_j(i-1) - 2\phi_j(i) \quad [1]$$

where $\phi(i)$ is the phase of the image at voxel i along a direction j. This kernel has 27 voxels and 13 discrete directions passing through the central voxel, with the coordinates of (1,0,0), (0,1,0), (0,0,1), (1,1,0), (1,−1,0), (1,0,1), (1,0,−1), (0,1,1), (0,−1,1), (1,1,1), (1,−1,1), (1,1,−1), and (1,−1,−1) (FIG. 24a). This kernel also has 26 discrete directions originated from the central voxel (FIG. 24b). $\phi(i+1)$ and $\phi(i-1)$ are the phase at the neighboring points of i along the direction j. Because the phase in venous blood is lower than that in the surrounding tissue, a SPD operator is expected to have a positive value at a voxel located on a vein. SPD can also be defined as the minimum of the phase differences $\phi_j(i+1) - \phi_j(i)$ and $\phi_j(i-1) - \phi_j(i)$, with reduced sensitivity to the local phase change introduced by uncompensated flow effect and bulk motion:

$$SPD'_{ij} = \min[\phi_j(i+1) - \phi_j(i), \phi_j(i-1) - \phi_j(i)]. \quad [2]$$

For a 3D complex image $\vec{A}(i)$, Eq. [1] becomes:

$$SPD_{ij} = \angle \left[ \frac{\vec{A}(i+1)}{|A(i+1)|} \cdot \frac{\vec{A}(i-1)}{|A(i-1)|} \cdot \frac{\vec{A}^*(i)}{|A(i)|} \cdot \frac{\vec{A}^*(i)}{|A(i)|} \right], \text{ or} \quad [3]$$

$$SPD_{ij} = \angle \left[ \vec{A}(i+1)\vec{A}(i-1)\vec{A}^*(i)\vec{A}^*(i) \right].$$

Eq. [2] becomes:

$$SPD'_{ij} = \min\{\angle[\vec{A}(i+1)\vec{A}^*(i)], \angle[\vec{A}(i-1)\vec{A}^*(i)]\} \quad [4]$$

where $\vec{A}^*(i)$ is the complex conjugate of $\vec{A}(i)$, the symbol $\angle$ denotes the operation of taking the polar angle of a complex value. It is noteworthy that the SPD operator is calculated using complex multiplication without the need for phase unwrapping. In the rest of the paper, SPD' in Eq. [4] is considered as an alternative calculation of SPD shown in Eq. [2].

The SPD operator is expected to have the following properties: (1) It has a large positive value along a direction perpendicular to the vein and a small, positive or negative, value along the vein. (2) It has a large negative value perpendicular to the vessel edge and a small value, positive or negative, along the vein. (3) It has a small value in background along all direction. (4) It has a large value on noise spikes along all direction. The SPD is used to construct two filters to enhance the venous structure, suppressed background phase even in regions with severe field inhomogeneity, and suppress noise spikes.

Different SPD-based filters may be designed to enhance the venous contrast. In one embodiment, a squared-sum SPD filter is constructed using the SPD operators at position i, along j=x, y, and z directions:

$$SPD_{ij} = \sqrt{SPD_{ix}^2 + SPD_{iy}^2 + SPD_{iz}^2}. \quad [5]$$

In another embodiment, a cross-sectional SPD filter is provided. For a small vein in the 3D kernel at pint i in the direction $\vec{j}$, $SPD_{ij}$ has a value close to zero. A SPD, however, along direction perpendicular to $\vec{j}$, $SPD_{ij}^n$, has large positive values, where n=1, . . . , N is the index for the direction perpendicular to $\vec{j}$. The averaged $SPD_{ij}^n$ also has a large positive value, resulting in a large positive value for ($SPD_{ij}$ − $SPD_{ij}^n$). Based on this reasoning, the implementation of the cross-sectional filter is expressed as:

$$\max_{j=1,\ldots,13} \left[ \frac{1}{N} \sum_{n=1}^{N} SPD_{ij}^n - \max(0, SPD_{ij}) \right]. \quad [6]$$

For a point on a small vein at point i along direction $\vec{j}$, max(0, $SPD_{ij}$) has a small value and the average of $SPD_{ij}^n$ has a large and positive value. The cross-sectional filter, therefore, has a large and positive value at point i. For a noise spike, both terms in Eq. [1] have large positive values. The difference between them tends to be small.

In one embodiment, the cross-sectional SPD filter is implemented by the following steps: (a) Calculate the SPD of a voxel along a discrete direction $\vec{j}$ within the kernel. Set the value to zero if SPD is negative. (b) Calculate the average of the SPDs along directions (n=1, . . . , N) perpendicular to $\vec{j}$. (c) Subtract max (0, $SPD_{ij}$) from the average of the SPDs. (d) Repeat steps from (a) to (c) for all 13 discrete directions and use the maximum value as the value of the filtered image at point i.

Figure 23:
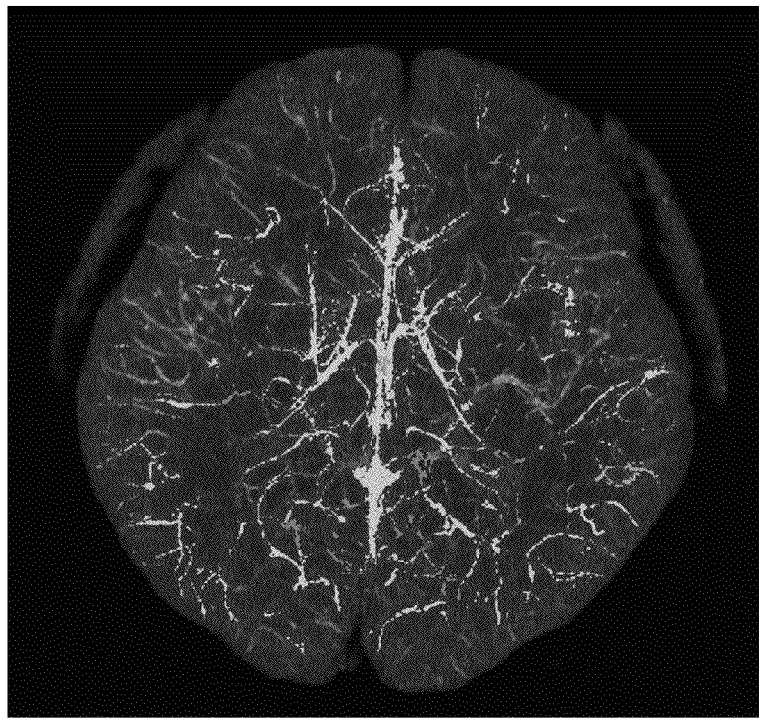
FIG. 23 provides an illustrative output of a second-order phase difference (SPD) cross-sectional filter.

Yet another embodiment of a SPD filter is a long-range cross-sectional SPD filter. A long-range SPD operator can be defined as:

$$LRSPD_{ij,M} = 2\phi_j(i+M) + 2\phi_j(i-M) - \phi_j(i+1) - \phi_j(i-1) - 2\phi_j(i) \quad [7]$$

where M is a signal correlation range of the operator. The SPD operator is a special case of $LRSPD_{ij,M}$ when M=1. The $LRSPD_{ij,M}$ operator enhances cylindrical structures with a diameter of (2M−1) voxels or smaller. A long-range operator, $g_{ij,M}$, defined as:

$$g_{ij,M} = \frac{1}{N} \sum_{n=1}^{N} LRSPD_{ij,M}^n - \max(0, LRSPD_{ij,M}) \quad [8]$$

where N is the number of discrete directions that are perpendicular to $\vec{j}$. The maximum value of $g_{ij,M}$ over the 13 discrete directions provides an estimate of whether the voxel at i is on a vein or not. If the voxel at i is on a vein, the vein is most likely in the direction $\vec{j}$ at which $g_{ij,M}$ has the maximum value. A long-range filter may then be constructed to use the relationship between $g_{ij,M}$ and the orientation of a vein. One underlying assumption may be that a small vein has a strong orientation-dependent correlation within a small cubic volume of $[2(M+K)-1] \times [2(M+K)-1] \times [2(M+K)-1]$ voxels. The long-range filter with a signal correlation range of M and orientation-dependent correlation range of K is given by:

$$\max_{j=1,\ldots,13} \left( \sum_{k=-K}^{K} g_{(i+k)j,M} \right), \quad [9]$$

where $$\sum_{k=-K}^{K} g_{(i+k)j,M}$$

is the summation of $g_{ij,M}$ along the direction $\vec{j}$. An illustrative output of the SPD cross-sectional filter is shown in FIG. 23.

In some other embodiments, a second-order magnitude difference (SMD) operator may be applied. The above image-domain filters were applied to the phase images. The negative venous contrast in the magnitude images can be used to combine with the venous contrast obtained with SPD filtering to further enhance the venous contrast in the final MRV. Similar to the definition of the SPD operator, a SMD operator is defined as:

$$SMD_{ij} = S_j(i+1) + S_j(i-1) - 2S_j(i) \quad [10]$$

where S(i) is the image intensity in the magnitude images at voxel i along a direction j. The SMD can also be defined as the minimum of $S_j(i+1)-S_j(i)$ and $S_j(i-1)-S_j(i)$, with reduced sensitivity to the local phase change introduced by uncompensated flow effect and bulk motion:

$$SMD'_{ij} = \min[S_j(i+1)-S_j(i), S_j(i-1)-S_j(i)]. \quad [11]$$

The voxel on the edge of an artery, $S_j(i+1)$, has a higher signal intensity than its two neighboring voxels $S_j(i)$ and $S_j(i-1)$ in parenchyma due to time-of-flight inflow enhancement, while $S_j(i)$ and $S_j(i-1)$ have similar intensities. Artificial signal enhancement can occur on the edge of arteries with the SMD defined in Eq. [10], but not with the SMD' defined in Eq. [11].

Because the veins have lower intensity than the surrounding tissue, a SMD operator is expected to have a positive value at a voxel located on a vein. The properties of the SMD operator are similar to that of a SPD filter in SWI. The squared-sum SMD filter, cross-sectional SMD filter, and long-range cross-section SMD filter are constructed by replacing $SPD_{ij}$ with $SMD_{ij}$ in Eqs. [1-9].

Various embodiments provide for a hybrid of SPD and SMD filtering. A hybrid cross-sectional filter can be constructed using the SPD and SMD operators:

$$G(i) = \max_{j=1,\ldots,13} \left\{ \sqrt{\alpha^2 \left[ \frac{1}{N} \sum_{n=1}^{N} SPD_{ij}^n - \max(0, SPD_{ij}) \right]^2 + \beta^2 \left[ \frac{1}{N} \sum_{n=1}^{N} SMD_{ij}^n - \max(0, SMD_{ij}) \right]^2 } \right\} \quad [12]$$

where $\alpha$ and $\beta$ are the weighting factors to be determined.

The selection of $\alpha$ and $\beta$ gives difference weighting to the SPD and SMD parts. For example, consider two extreme situations. In a vein with a maximum phase difference of $\pi$, $$\frac{1}{N} \sum_{n=1}^{N} SPD_{ij}^n - \max(0, SPD_{ij}) = 2\pi.$$

In a vein that totally dark (i.e., zero intensity) at a normalized background intensity of 1.0, $$\frac{1}{N} \sum_{n=1}^{N} SMD_{ij}^n - \max(0, SMD_{ij}) = 2.$$

As such, we can select $\alpha=1$ and $\beta=\pi$ to make an equal weighting of the SPD part and the SMD part. Similarly, a hybrid long-range cross-sectional filter can be constructed.

Certain embodiments may experience high levels of noise in air regions in the filtered images. As such, it may be desirable to provide noise suppression in air. The phase in tissue is near constant in a 3×3×3 volume. The phase in a 3×3×3 volume containing a vein has two groups: the tissue group has a nearly constant phase and the veins have smaller phase. We can use the first-order phase difference (FPD) of the along 26 directions, starting from the center of the kernel, $PD_1$, $PD_2, \ldots, PD_{26}$, to calculate the standard deviation of FPD (see FIG. 24b):

$$\sigma_i = \sqrt{\frac{1}{25} \sum_{j=1}^{26} (FPD_{ij} - \overline{FPD_i})^2}, \quad [13]$$

where $FPD_{ij} = \angle[\vec{A}(i+1)\vec{A}^*(i)]$ is the phase difference between $\vec{A}(i)$ and its nearest neighboring voxel along direction $\vec{j}$, $$\vec{A}(i+1) \cdot \overline{FPD_i} = \frac{1}{26} \sum_{j=1}^{26} FPD_{ij}$$

is the averaged FPD at i along 26 directions.

The standard deviation is expected to have a large value when the 3×3×3 volume is in air and has a small value when the 3×3×3 volume is in tissue. We can construction a Fermi weighting function:

$$Fermi(\sigma) = \frac{1}{1 + e^{(\sigma-R)/W}}, \quad [14]$$

with a filter width of R and transition width of W. With proper selection of the parameter R and W, the value of the Fermi weighting function is expected to be nearly unity in tissue and nearly zero in air. The value of the Fermi weighting function will be multiplied to the bright-vein filter value.

The FPD in air is fully randomized and has a range of $[-\pi, \pi]$. The estimated standard deviation in air is $\sigma_{air}=2\pi/\sqrt{12}=0.577\pi$. It is reasonable to select R to be near $0.5\sigma_{air}$ and W much smaller than R. In this study, we selected $R=0.2\pi$ and $W=0.02\pi$.

In some embodiments, it may be desirable to remove edge artifacts. Both SPD and SMD can have a large value in the voxel on the interface of brain tissue and air, resulting in elevated intensity on the surface of the brain in the filtered MRV. These voxels on the surface of the brain can obscure the vascular structure in in-plane MIP display and have similar appearance of the veins in the through-plane MIP display. Several approaches can be used to substantially reduce this edge artifact. A simple approach is to set the filter value to zero if any voxel in the 3×3×3 volume has a Fermi function value (or image intensity value) below a threshold. The threshold was selected to separate air from brain tissue. This approach may exclude too many voxels in brain tissue in the filtered SWI images, we employed a less strict approach in this study. In this approach, the SPD value will be set to zero if any of the three voxels used in the calculation has a Fermi function value (or image intensity value) below a threshold.

Figure 22:
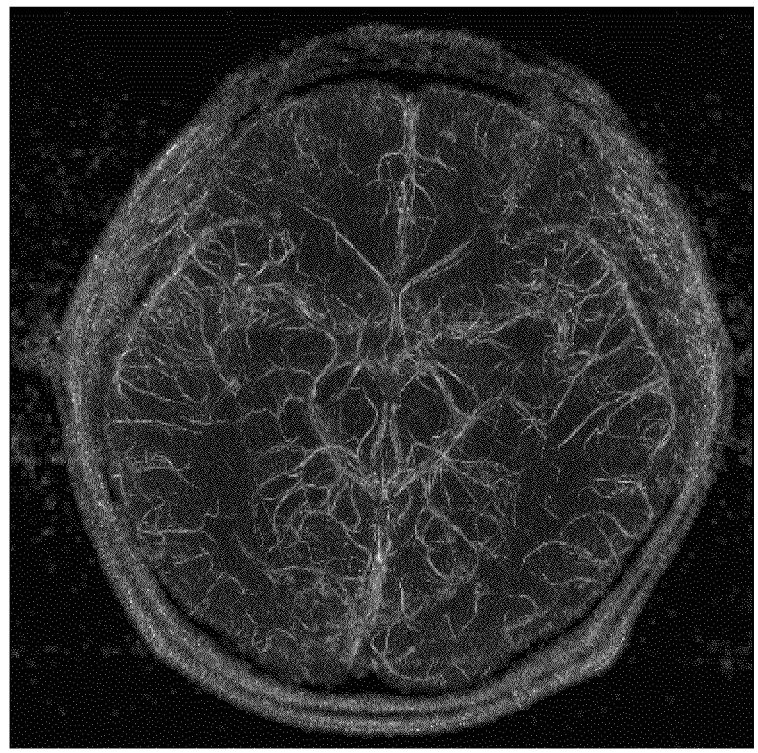
FIG. 22 provides an exemplary illustration of a MIP of MRV data with positive venous contrast.

FIG. 22 provides an exemplary illustration of a MIP of MRV data with positive venous contrast. A long-range cross-sectional SPD filter (M=1, K=1) was applied to a 3D spoiled gradient-recalled echo (SPGR) data acquired with TE=20 ms and a matrix size of 512×384×64. A Fermi weighting function ($\alpha=0.2\pi$ and $\beta=0.02\pi$, and a threshold of Fermi value=0.001) was applied to suppress the noise in air.

In other embodiments, echo-sharing approaches may be used to improve image quality, for example when partial echo acquisition is used in a multi-echo pulse sequence. In one embodiment, the unsampled portion of an echo is filled with sampled data from another echo.

Figure 8:
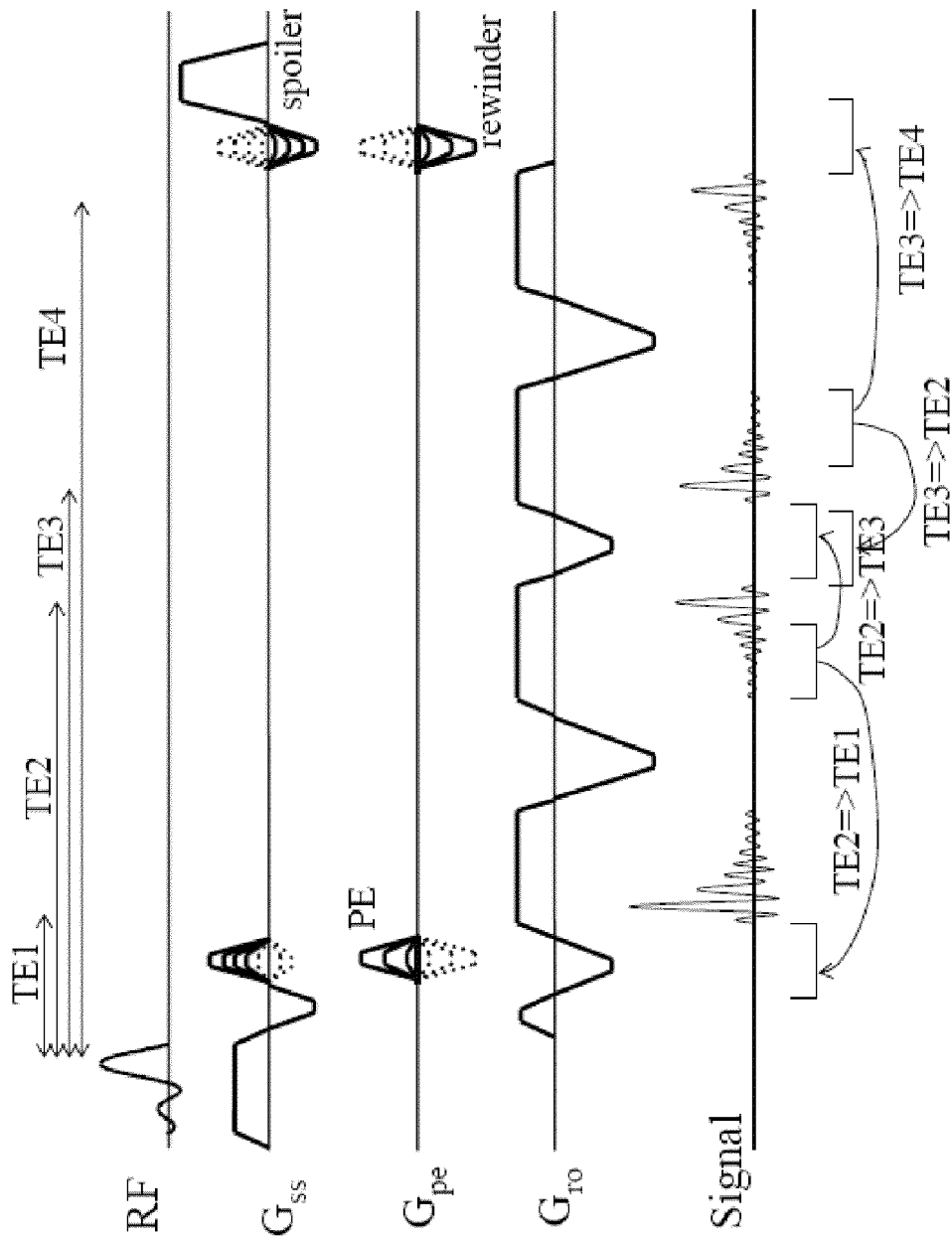
FIG. 8 provides an exemplary embodiment of a multi-echo pulse sequence for use with an echo-sharing approach according to the invention.

FIG. 8 provides an exemplary embodiment of a multi-echo pulse sequence for use with an echo-sharing approach according to the invention. As illustrated, four echoes are acquired, each having unsampled data on either side of its peak. This unsampled data can be "filled in" by using data from other echoes. For example, FIG. 8 shows the later part of the third echo data being used to fill in the unsampled later part of the second and forth echo. Further, the beginning part of the second echo is used to fill in the unsampled beginning part of the first and third echo.

Figure 9:
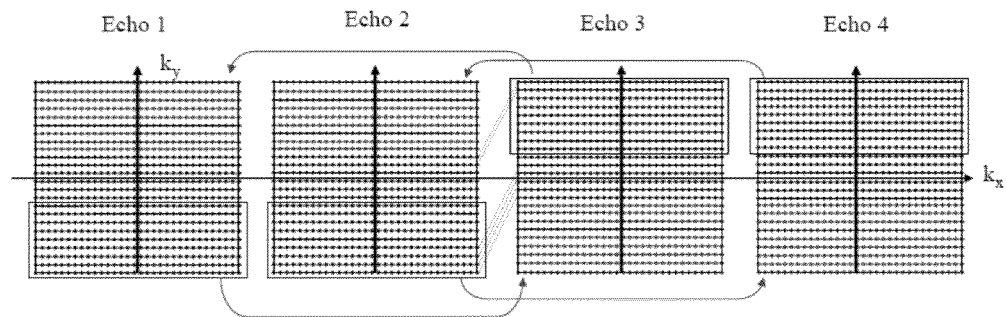
FIG. 9 provides an exemplary embodiment of a view-sharing approach according to the invention.

Yet other embodiments may provide view-sharing approaches. View-sharing may improve image quality with under-sampled multi-echo acquisition. FIG. 9 provides an exemplary embodiment of a view-sharing approach according to the invention. As illustrated, the unsampled ky lines in one echo are filled in by the sampled ky lines in another echo. The dots outside the regions enclosed by the rectangles are sampled data. The circles inside the regions enclosed by the rectangles are unsampled data, filled in by the sampled data in another echo, as indicated by the rectangles, through view-sharing. The arrows represent the view-sharing from the sampled "donor" views to unsampled recipients.

Figure 10:
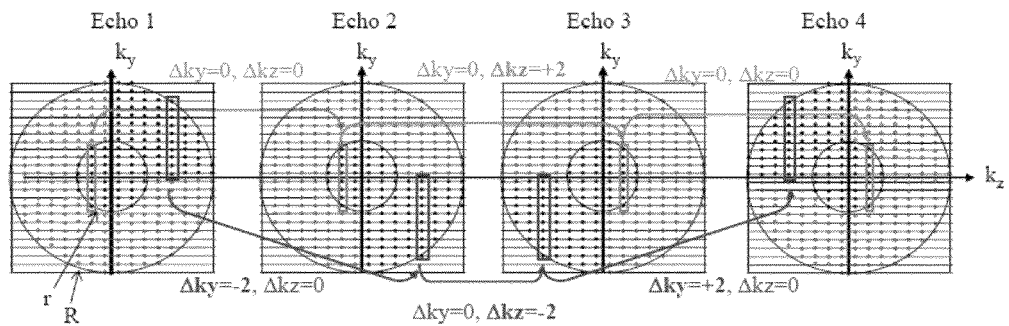
FIG. 10 provides another exemplary embodiment of a view-sharing approach according to the invention.

FIG. 10 provides another exemplary embodiment of a view-sharing approach according to the invention. The embodiment of FIG. 10 shows a circular view-sharing approach, in which low frequency k-space data inside a circular region with a radius of r is fully sampled in each echo. The k-space outside a circular region with a radius of R is not sampled. The k-space between the circles r and R is sampled in the first quadrant in Echo 1, the second quadrant in Echo 2, the third quadrant in Echo 3, and the fourth quadrant in Echo 4. The unsampled part of k-space is filled by sampled data in other echoes. According to FIG. 10, $$TimeRatio = \frac{\text{Actual Acquisition Time}}{\text{Original Acquisition Time}} = \pi \frac{r^2 + \frac{R^2 - r^2}{4}}{(2R)^2}.$$

Therefore, when r=R/2, the time ratio=$\pi[\frac{1}{4}+(1-\frac{1}{4})/4]*(\frac{1}{4})=\pi*\frac{7}{16}*(\frac{1}{4})=0.3436$. In this example, only 34.36% of (ky, kz) data need to be acquired to reconstruct the MRV, with a scan time saving of 65.64%. Further it may be desirable to add secondary Gy encoding between Echoes 1 and 2, Gz encoding between Echoes 2 and 3, and Gy encoding between Echoes 3 and 4. In certain embodiments, $\Delta kz$ is smaller than $\Delta ky$ due to the extension along kz being smaller when slice thickness is larger than in-plane pixel size. It may be preferable to place $\Delta kz$ in the middle of 4 echoes because that may be where the fly-back gradient area is smaller. Additionally, embodiments may apply the POCS algorithms along kx for all the sampled echoes between two central circles, r and R.

The embodiments thus far have been described largely with respect to single-slab data acquisition. It will be appreciated that the embodiments may be expanded in various ways to encompass multi-slab data acquisition. For example, during the idle period of the TR for one slab, data may begin to be acquired for another slab.

This approach, called slab interleaving, may allow data from multiple slabs to be acquired substantially in parallel to reduce scan times. For example, a pulse sequence may be used for slab-interleave simultaneous acquisition of MRA and SWI data. The order of excitations and readouts may be as follows: RF excitation of Slab 1, readout of Slab 1; RF excitation of Slab 3, readout of Slab 3; RF excitation of Slab 2, readout of Slab 2; RF excitation of Slab 1, readout of Slab 1; etc. Using this approach, the effective TR may be increased by the number of slabs, resulting in a higher SNR in the MRA and SWI images.

Figure 11:
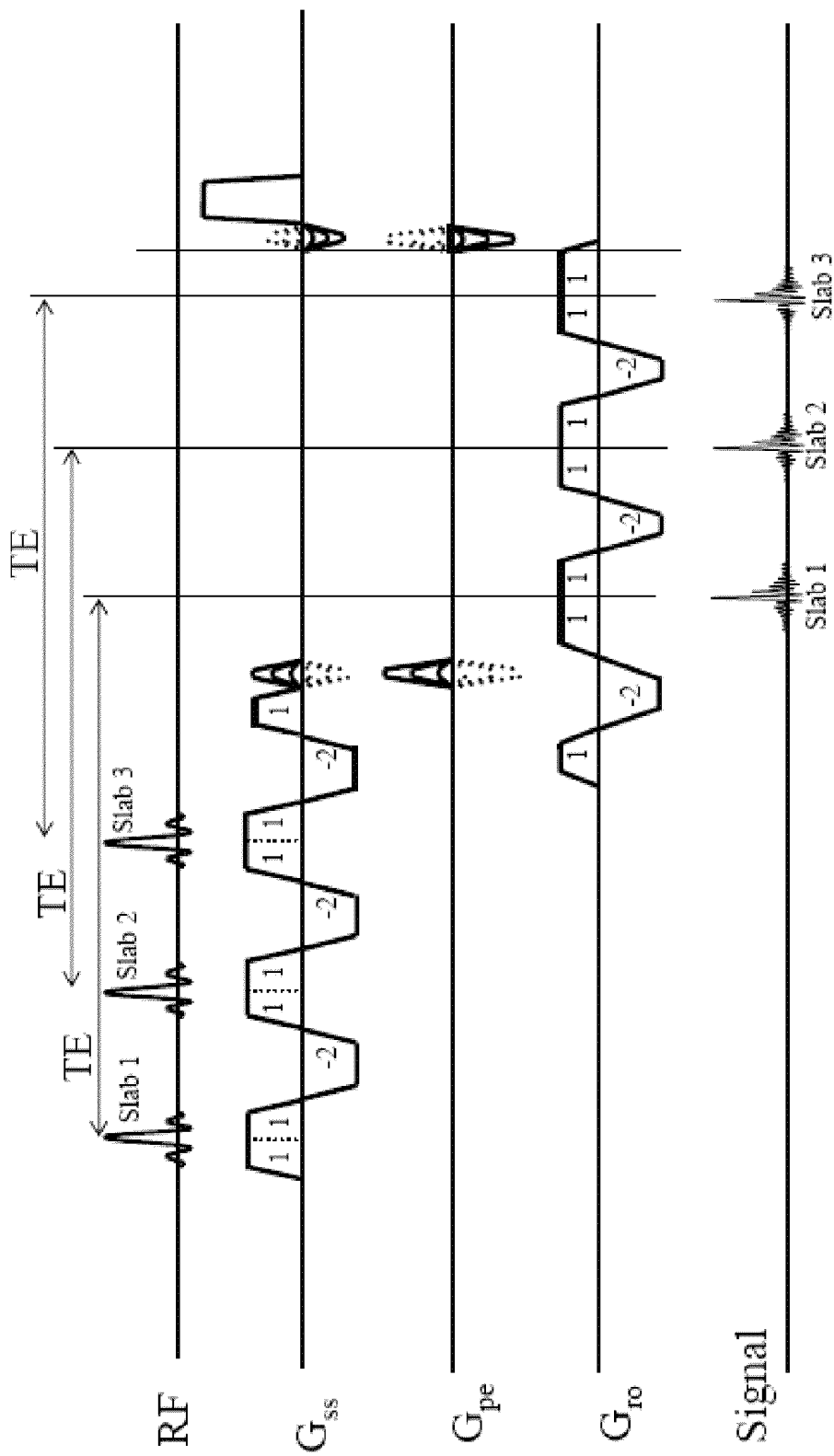
FIG. 11 provides an exemplary embodiment of a pulse sequence for use with a multi-slab temporally interleaved (MUSTI) SWI acquisition technique.

FIG. 11 provides an exemplary embodiment of a pulse sequence for use with a multi-slab temporally interleaved (MUSTI) SWI acquisition technique. The excitation and acquisition of the SWI data may be interleaved within a TR. This technique can substantially reduce the scan time in multi-slab acquisition. As illustrated in FIG. 11, Slabs 1, 2, and 3 are excited consecutively, followed by the acquisition of SWI data in Slabs 1, 2, and 3.

Figure 12:
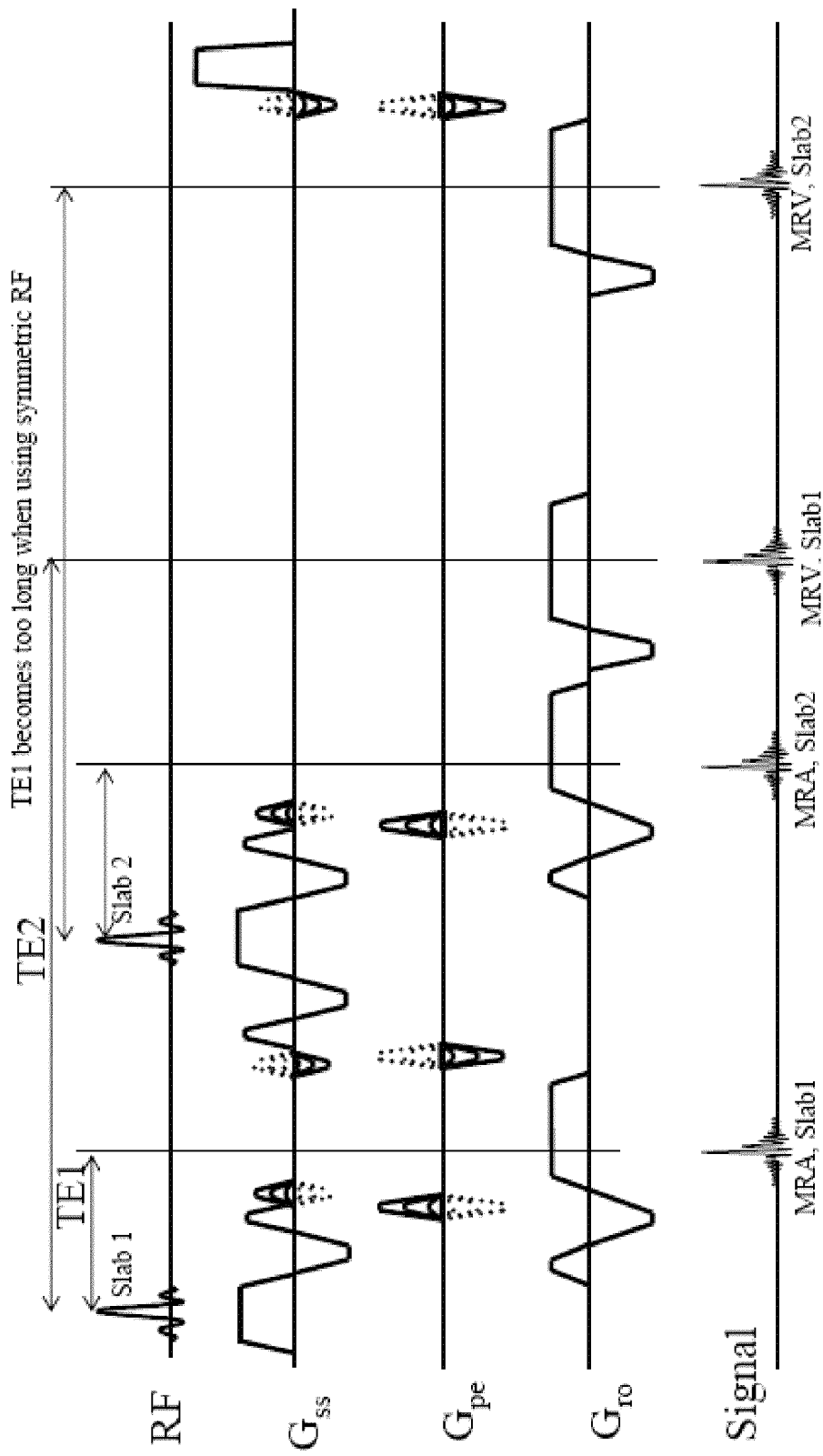
FIG. 12 provides an exemplary embodiment of a pulse sequence for use with dual-slab, dual-echo MRA and MRV acquisition according to the invention.

In other embodiments, the MUSTI approach may be used to simultaneously acquire MRA and MRV data. FIG. 12 provides an exemplary embodiment of a pulse sequence for use with dual-slab, dual-echo MRA and MRV acquisition according to the invention. Slab 1 is excited, followed by acquisition of MRA data from Slab 1. Phase rewinders and the excitation of Slab 2 follow the sampling of the MRA in Slab 1. The acquisition of MRA data in Slab 2 follows the excitation of Slab 2. The MRV data of Slabs 1 and 2 are acquired after the acquisition of MRA in Slab 2.

It will be appreciated that multi-echo, multi-slab, echo-sharing, view-sharing, interleaving, and other approaches (and combinations of approaches) may provide various benefits. For example, they may increase SNR, increase visibility of certain venous information, reduce artifacts, and/or reduce scan time. The exemplary embodiment of FIG. 10, for instance, may reduce scan time by 65.6% when R=2r.

Various embodiments of the invention provide for the substantially contemporaneous display (or overlay) of both arterial vasculature and venous vasculature. In one embodiment, the projection of arterial vasculature is displayed in one color and the projection of venous vasculature is displayed in another color for differentiation. In other embodiments, various user interface enhancements are provided. For example, users of the display system may be able to perform various image processing functions, including zooming in and out of the image, toggling between viewing either or both of the MRA or MRV data, changing resolutions, enhancing certain regions of the image, etc.

Embodiments of the invention may be performed in alternate environments. In one embodiment, the method is performed using 1.5-Tesla scans. A twice longer TE is required at 1.5-Tesla to achieve the same level of susceptibility weighting compared to that at 3-Tesla because of the difference in field strength. A second echo TE of approximately 56 milliseconds may be needed for venous blood parallel to the main field to be out-of-phase with parenchyma, making the optimal TR for MRV significantly longer than that for MRA alone. As such, adding acquisition for MRV may increase the total scan time, even with the dual-echo approach. The increase of TR required for MRV may also affect the vascular contrast in MRA because of the competing effects of the increase in-flow and weakened saturation of the stationary tissue. Careful selection of TR may therefore be necessary for optimal balance of vascular contrast in the MRA and MRV at 1.5 Tesla.

Figure 13:
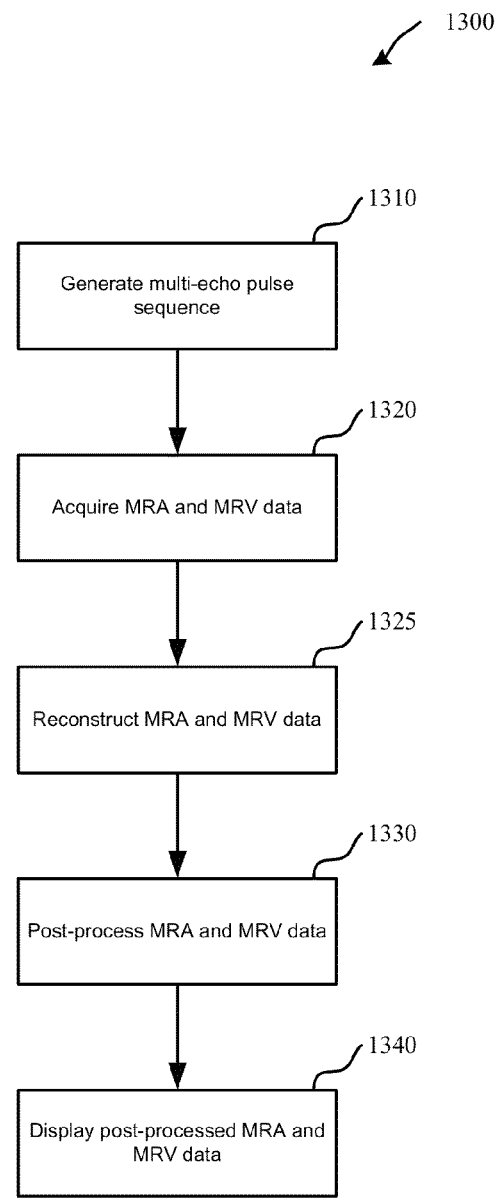
FIG. 13 provides a flow diagram of an exemplary method according to embodiments of the invention.

FIG. 13 provides a flow diagram of an exemplary method according to embodiments of the invention. The method 1300 begins at block 1310 with the generation of a multi-echo pulse sequence. MRA and MRV data may be acquired from the multiple echoes at block 1320. In some embodiments, the acquired MRA and MRV data are reconstructed at block 1325. In some embodiments, the acquired MRA and MRV data is then post-processed at block 1330. In other embodiments, the post-processed data is then displayed in a substantially contemporaneous fashion at block 1340.

It will be appreciated that other approaches may be used in 3D TOF MRA without departing from the invention. For example, radio-frequency spatial saturation may reduce signals from downward venous flow, tilted optimized nonsaturating excitation (TONE) may make upward in-flow arterial blood appear more uniform, and certain pulses may saturate signals from stationary tissue.

Illustrative Experimental Results

The following is a description of an embodiment of an experiment with illustrative results. The description is intended for clarity only, and should not be construed as limiting the scope of the invention in any way. The experiment explores the use of SWI-based MRV to exploit differences in magnetic susceptibility between venous blood and background tissue as an intrinsic contrast mechanism for the depiction of venous vasculature.

In the illustrative SWI-MRV technique, three-dimensional (3D) flow-compensated gradient-echo data are acquired with a relative long TE to visualize the venous vasculature in the sub-millimeter regime. The veins have a negative phase relative to the surrounding tissue. Complex division of the original images and low-pass (LP) filtered images is used to generate high-pass (HP) filtered phase images in which the slow-varying background phase is removed and phase change in the veins is preserved. A 3D phase mask is constructed by truncating and scaling the phase value in the HP-filtered phase images. The veins also have a negative contrast in the magnitude images due to shortened T2* in large veins and out-of-phase partial volume signal cancellation in voxels containing sub-voxel small veins. The magnitude images are multiplied by the phase mask several times to generate SWI with enhanced venous contrast (i.e., vein-to-background contrast). The venous contrast in the resulting SWI is the combination of venous contrast in the magnitude images and phase images. A mIP approach is used for the display of 3D MRV, for example, because of the negative venous contrast.

In some embodiment, artifacts arise during the construction of the 3D phase mask in regions with severe field inhomogeneity due to the off-resonance effect. The LP filter is designed to achieve two objectives: removing the phase difference in the veins and preserving the phase variation in the background. After complex division of the original images by the LP-filtered images, the phase difference in the veins is highlighted and the phase variation in the background is removed in the resulting HP-filtered phase images. Some embodiment address these two objectives in most of the brain regions by adequate selection of the filter size. In regions with severe field inhomogeneity, however, the LP filtering may not completely preserve the phase in the background, which may generate large residual background phase in the HP-filtered phase images and subsequent phase mask. After multiple multiplications of the phase mask with the magnitude images, the residual phase generates dark bands or dark regions in SWI, as referred to off-resonance artifact.

In certain embodiment, artifacts arise from the mIP display of the 3D MRV. In conventional mIP implementation, the minimum intensity in voxels along a projection path is selected for the display. Even in through-plane projection, voxels in air and bone can be in the path of projection in the peripheral regions due to the nature shape of the brain. The low intensity in air or bone results in the loss of signal from veins and brain tissue in the mIP image in these regions. For 3D SWI data acquired at a transverse plane, sagittal and coronal projections may be desired for clinical evaluations. The low intensity in air and bone may make conventional mIP infeasible for in-plane display of MRV.

The illustrative experiment illustrates the effect of the size of LP filter on the severity of the off-resonance artifact in phase mask. Embodiments present approaches to using LFG measurements to assess the severity of field inhomogeneity. A Fermi weighting function may be introduced based on the LFG measurements to suppress residual background phase in the phase mask and to reduce the off-resonance artifact in SWI. A volume-segmented mIP (VS-mIP) algorithm may be employed to enable in-plane mIP display of MRV and to avoid the signal loss in through-plane mIP in the peripheral regions of the brain.

In one embodiment, a transverse 3D spoiled gradient-recalled echo (SPGR) dataset is acquired on a GE 3T scanner (Milwaukee, Wis., USA) with a healthy subject using a standard birdcage head coil. Standard consent procedure is complied. The following imaging parameters are used in the scans: field of view (FOV)=26 cm×19.5 cm; 1.0 mm slice thickness; 512×384×64 matrix; full echo acquisition; readout bandwidth=±31.3 kHz; and TE/TR/$\alpha$=20 ms/34 ms/20°. The scan time is 14 minutes. Flow compensation is applied along the readout direction to reduce the phase variation caused by blood flow. The 3D complex SWI data are reconstructed using MATLAB (The MathWorks, Inc., Natick, Mass., USA). Zero-filled interpolation is applied along the slice direction to generate a 3D dataset of 512×384×128. The apparent voxel dimension after the interpolation is 0.51× 0.51×0.5 mm$^3$, which is nearly isotropic. Four slices at the top and bottom of the 3D dataset are removed to reduce the wrap-around artifact, resulting in a total number of 120 slices.

A symmetric 2D Hamming window is applied to the 2D k-space data from each slice to generate the LP-filtered images. HP-filtered phase images are obtained by complex division of the original images and the LP-filtered images. A phase mask is constructed from the HP-filtered phase images using a standard procedure.

Veins in regions with severe field inhomogeneity are usually well depicted in the magnitude images. These veins are obscured in SWI because of the large residual background phase in phase mask. LFG, the first order spatial variation of the static magnetic field, is used to assess the severity of field inhomogeneity. The feasibility of direct 3D LFG mapping using two SPGR datasets acquired at different TEs without phase unwrapping has been demonstrated. The illustrative experiment extends the technique for 3D LFG mapping, as described below, using only one SPGR dataset.

The spatial variation of phase, $\delta\phi_{s,u}$, caused by the LFG along a direction, u, in the complex MR signal, $A(r)$, can be calculated by: $\exp[i\delta\phi_{s,u}(r)]=\exp[i\phi(r+\Delta u)-i\phi(r-\Delta u)]=U_{\Delta u}U^*_{-\Delta u}$, where r is the spatial location, $\phi$ is the phase, $U_{\Delta u}=A(r+\Delta u)/A(r+\Delta u)$, $U^*_{-\Delta u}=A^*(r-\Delta u)/A(r-\Delta u)$, $A(r)=|A(r)|$, and $\Delta u$ is the voxel size along the direction u (u=x, y, or z). The LFG along u at location r can be calculated by: $LFG_u(r)=\delta\phi_{s,u}(r)/(\gamma TE \cdot 2\Delta u)=\angle(U_{\Delta u}U^*_{-\Delta u})/(2\gamma TE\Delta u)$, where $\gamma$ is the gyromagnetic ratio and the sign $\angle$ indicates an operation to take the polar angle of a complex number. In some embodiments, a median filter is applied to $LFG_x(r)$, $LFG_y(r)$, and $LFG_z(r)$ to reduce the effect of rapid phase change that may occur in vessels and other fine structures. The median filter with a kernel of 27 evenly-spaced points in a 5×5×5 cube is applied to the 512×384×120 dataset.

The amplitude of the LFG is given by the equation for $LFG(r)$ described above. The LFG-suppressed phase images are generated by multiplying the HP-filtered phase images with a Fermi weighting function defined by the equation for Fermi(LFG), as described above.

The background phase has a large (positive or negative) value in the HP-filtered phase images in the regions with severe field inhomogeneity. After multiplying with Fermi (LFG), the background phase is reduced to near zero when the parameters R and W are selected so that Fermi(LFG)<<1 in regions with a large LFG value and Fermi(LFG)≈1 in regions with relatively homogeneous field. The resulting phase mask, as referred to LFG-suppressed phase mask, has a value near unity in regions with severe field inhomogeneity. The venous contrast in the magnitude images is preserved in the resulting SWI, as referred to LFG-suppressed SWI, after multiple multiplications of the magnitude images with the LFG-suppressed phase mask.

In some embodiments, a retrospective linear shimming procedure is applied to the 3D SPGR data to reduce large scale background LFG in the data, since such background LFG can possibly reduce the contrast of the veins in SWI. The average $LFG_x$ value is measured in a large rectangular region in the middle parietal of the brain where the B0 field is relatively uniform. The $LFG_x$ map of the entire brain in the slab is then subtracted by the average $LFG_x$ value. The same procedure is repeated for the $LFG_y$ and $LFG_z$ maps. The resulting magnitude LFG map has a considerably reduced LFG value in the background after the retrospective linear shimming.

In certain embodiments, slice-by-slice segmentation is performed manually to remove air, bone, and intracranial non-brain tissue using the magnitude images to generate a 3D binary mask. The voxels of brain tissue in the binary mask have a value of "1" and the rest of the voxels have a value of "0". In the VS-mIP, the projection is only applied to voxels with a value of "1", excluding the voxels with a value of "0". The VS-mIP approach can be applied to phase mask, magnitude image, or SWI. Residual voxels in air, bone, and low intensity non-vascular voxels may have a low intensity in the projection. An erosion algorithm is used to remove 3 more layers of voxels in the 3D binary mask prior to VS-mIP to exclude these residual voxels.

Figure 14:
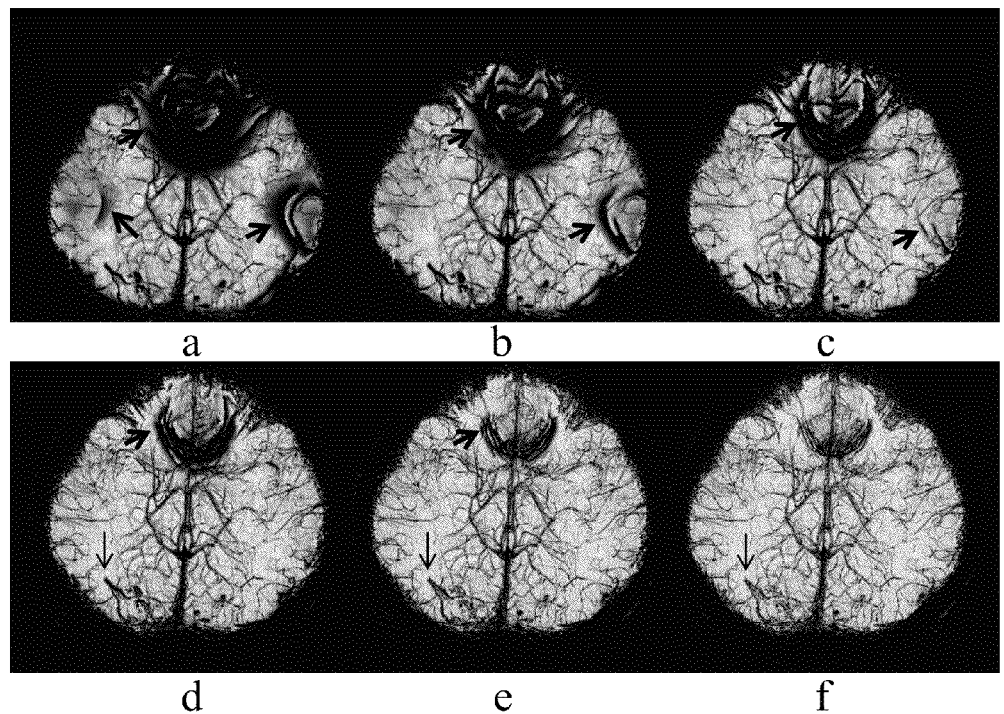
FIGS. 14a-14f provide exemplary illustrations of the minimum intensity projection of a 3D phase mask, obtained with various low-pass filter sizes.

FIG. 14 shows an illustrative mIP of a 3D phase mask, obtained with a LP filter size of 48×36 (a), 64×48 (b), 96×72 (c), 128×96 (d), 192×144 (e), and 256×192 (f), respectively. Phase artifacts at the orbitofrontal and lateral temporal regions, as indicated by thick arrows, are reduced with a larger filter size. The reduction of contrast of medium-size veins becomes noticeable when a filter of 256×192 is used. The filter size of 192×144 is determined to be optimal in this example. Since the contrast of small veins may be low in a phase mask, the phase mask is commonly multiplied to the magnitude images multiple times to enhance the contrast in the final SWI. This approach may be substantially equivalent to multiplying the phase mask by itself multiple times to form an enhanced phase mask prior to the multiplication of the enhanced phase mask to the magnitude images. For better display of the contrast of small veins, enhanced phase masks may be used. For example, 4 multiplications are used in FIG. 14.

Figure 15:
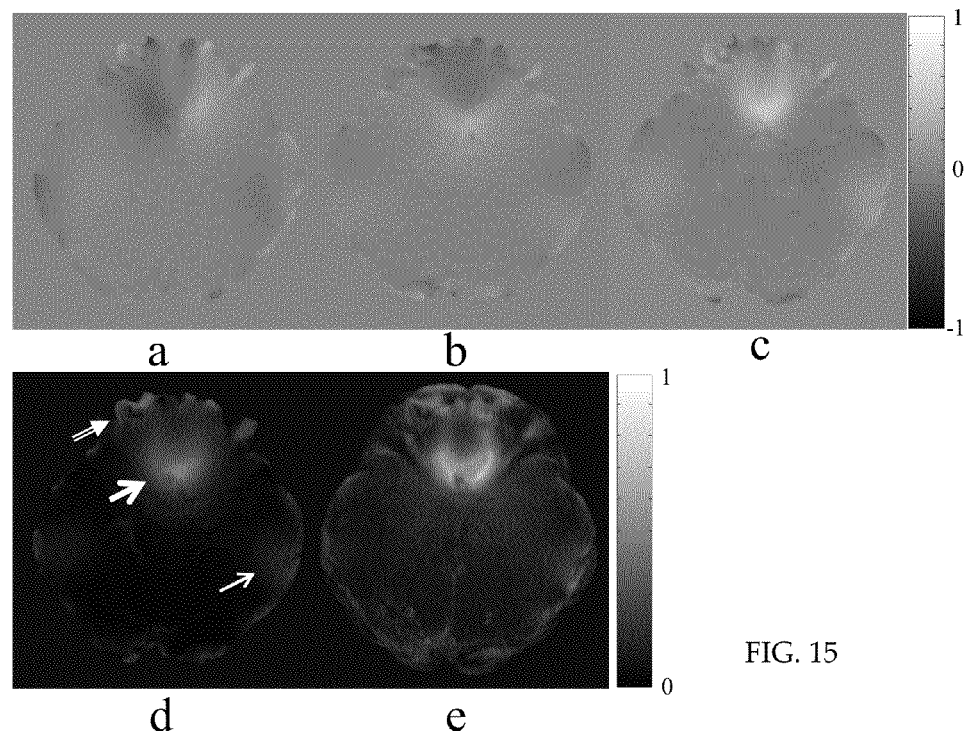
FIGS. 15a-15e provide exemplary illustrations of various local field gradient maps at a slice covering the orbitofrontal region of a brain after median filtering.

FIG. 15 shows illustrative results of the $LFG_x$, $LFG_y$, $LFG_z$, and LFG maps at Slice 12 covering the orbitofrontal region after median filtering. The through-plane maximum-intensity projection of LFG of the entire transverse slab is shown in FIG. 15e, with the maximum LFG value of 0.745 mT/m at the orbitofrontal region, as indicated by a thick arrow. The lateral temporal region, as indicated by a thin arrow, and the frontal pole, as indicated by a double-lined arrow, also have an increased LFG.

Figure 16:
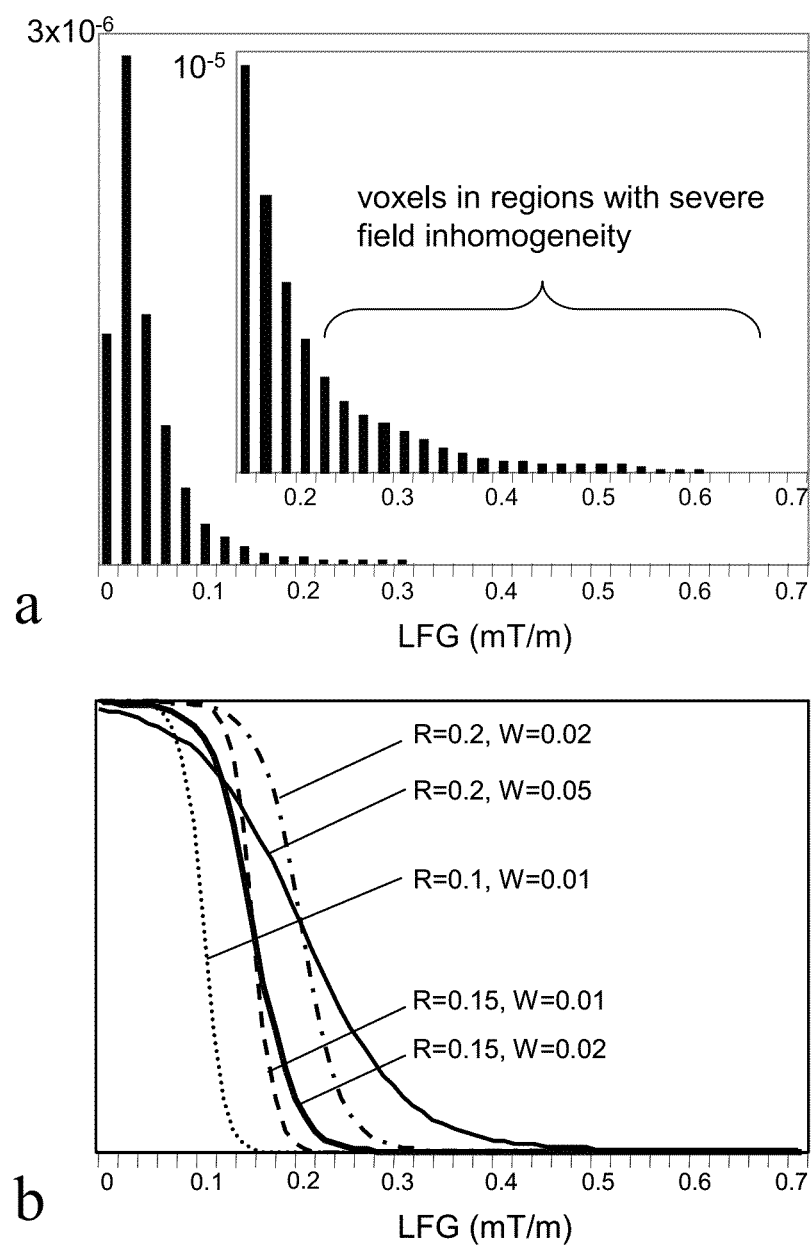

An illustrative histogram of LFG in the entire brain volume covered in this slab is shown in FIG. 16a. Approximately 2.8% of the voxels are in regions with LFG≥0.2 mT/m. The insert shows a histogram with finer vertical scale to presents more details for voxels in regions with severe field inhomogeneity. This histogram suggests that R=0.1-0.2 mT/m is likely a reasonable selection. FIG. 16b shows illustrative profiles of the Fermi weighting functions with (R(mT/m), W(mT/m))=(0.1, 0.01), (0.15, 0.01), (0.15, 0.02), (0.2, 0.02), and (0.2, 0.05), respectively.

Figure 17:
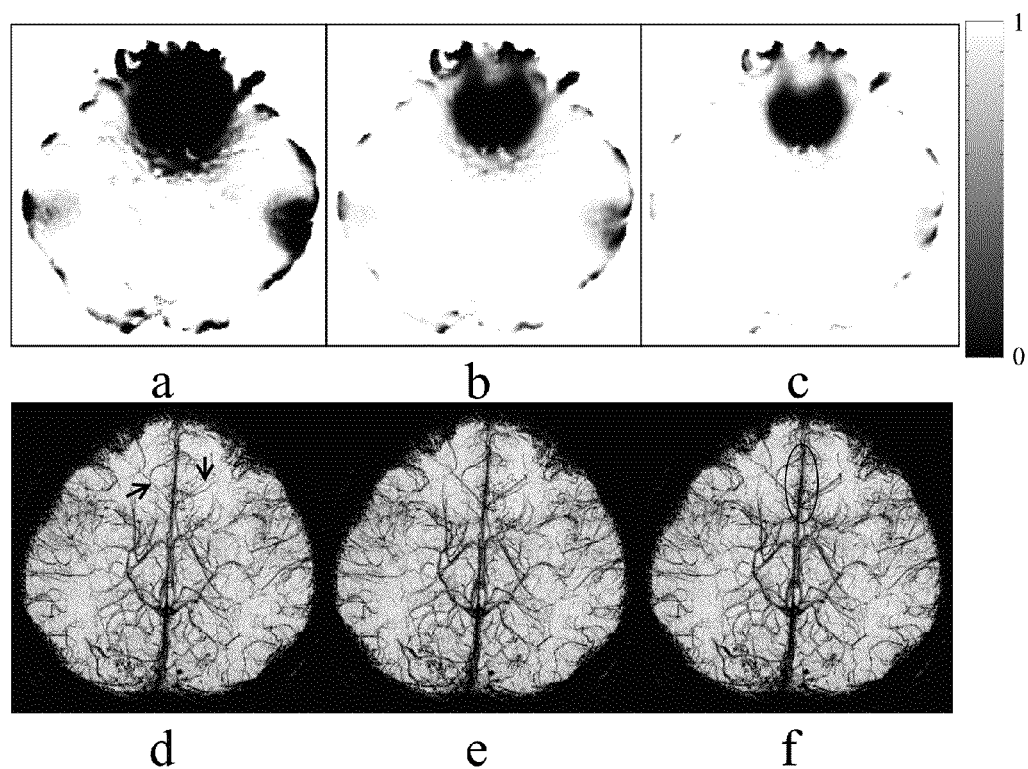
FIGS. 17a-17c provide exemplary illustrations of Fermi weighting functions applied to 3D local field gradient maps to obtain 3D datasets of filter values.
FIGS. 17d-17f provide exemplary illustrations of minimum intensity projections of enhanced phase masks with local field gradient suppression, using the local field gradients shown in FIGS. 17a-17c.

In the embodiment shown, the Fermi weighting function with these R and W parameters is applied to the 3D LFG map to obtain a 3D dataset of the filter values. Illustrative values of the Fermi weighting function at Slice 12 are displayed as a map shown in FIGS. 17a-17c, with (R(mT/m), W(mT/m))= (0.1, 0.01), (0.15, 0.02), and (0.2, 0.02), respectively. FIG. 17a shows a rather extended LFG suppression at the orbitofrontal region, frontal pole, and lateral temporal region. FIG. 17c shows a more focal LFG suppression, primarily at the orbitofrontal region and frontal pole. The mIP display of the enhance phase masks with LFG suppression in FIGS. 17d-17f shows nearly diminished off-resonance artifact at the orbitofrontal region. A few veins are still conspicuous at the orbitofrontal region in the enhanced phase mask, as indicated by a short arrow in FIG. 17d, even with the LFG suppression. Notably, the contrast of these veins is apparently slightly lower in FIG. 17d than that in FIG. 17e and FIG. 17f. The venous contrast in FIG. 17f is apparently similar to that in FIG. 17e. The noise level at the orbitofrontal region, however, is apparently slightly higher in FIG. 17f, as indicated by an ellipse, compared to that in FIGS. 17d and 17e.

R=0.15 m/mT and W=0.02 mT/m, as shown in FIG. 17e, are determined to provide the best suppression of the off-resonance artifact in the illustrative experiment. The mIP display of enhanced phase masks with (R(mT/m), W(mT/m)) =(0.15, 0.01) and (0.2, 0.05), not shown in this paper, is very similar to that in FIG. 17e, suggesting that high image quality of SWI can be obtained with a relatively wide range of selection of the R and W parameters.

Figure 18:
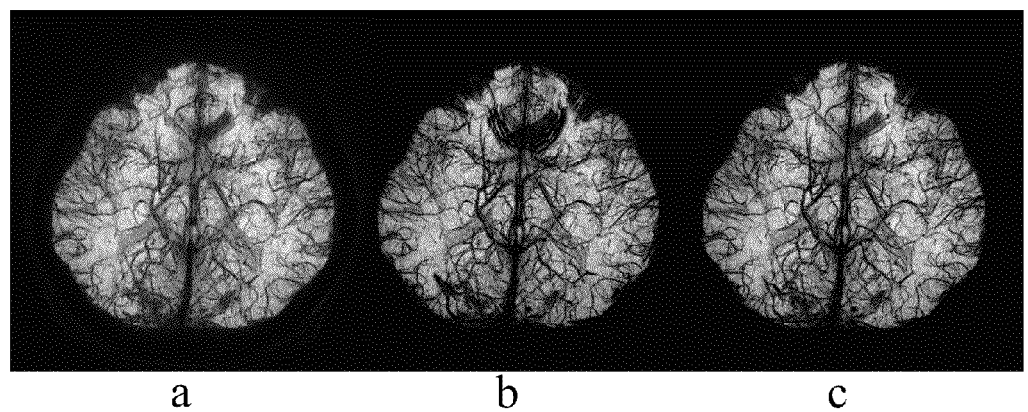
FIG. 18a provides an exemplary minimum intensity projection display of a magnitude image.
FIG. 18b provides an exemplary minimum intensity projection display of a conventional susceptibility weighted image.
FIG. 18c provides an exemplary minimum intensity projection display of a local field gradient-suppressed susceptibility weighted image.

FIG. 18 shows an illustrative mIP of the magnitude image (a), conventional SWI (b), and LFG-suppressed SWI with R=0.15 m/mT and W=0.02 mT/m (c). The venous vasculature has considerably higher contrast in the mIP of SWI (FIG. 18b) than in the mIP of the original magnitude images (FIG. 18a). A few veins located at the orbitofrontal region visible in the magnitude images, however, become obscured in conventional SWI. The veins at the orbitofrontal region are well depicted in the LFG-suppressed SWI, as shown in FIG. 18c.

Figure 19:
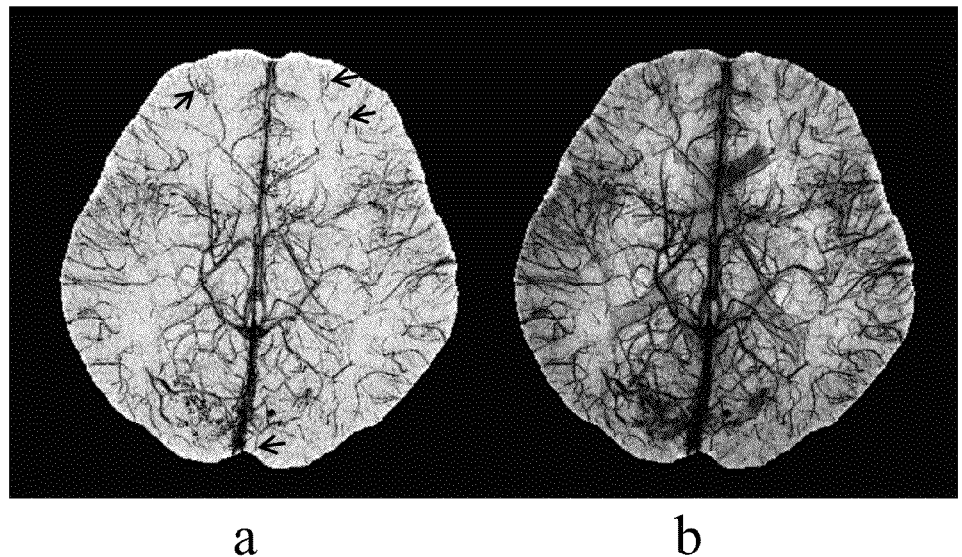
FIGS. 19a and 19b provide exemplary illustrations of effects of volume segmentation to through-plane minimum intensity projection display of enhanced phase mask with local field gradient suppression.
Figure 20:
FIG. 20 provides an exemplary illustration of a sagittal view of a volume-segmented minimum intensity projection of local field gradient-suppressed susceptibility weighted image data.

An illustrative effect of volume segmentation to the through-plane mIP display of the enhanced phase mask with LFG suppression (R=0.15 m/mT and W=0.02 mT/m) is shown in FIG. 19a. Several small veins not visible with conventional mIP display become conspicuous in the VS-mIP display, as indicated by the arrows in FIG. 19a. The contrast of these veins and other small veins at the peripheral regions of the brain is further improved in the VS-mIP display of the LFG-suppressed SWI, as shown illustratively in FIG. 19b. Volume segmentation also makes in-plane display of MRV feasible. An illustrative sagittal view of the VS-mIP of the LFG-suppressed SWI data is shown in FIG. 20. As shown, most of the small veins may be well depicted using this technique.

Difference in magnetic susceptibility is the source of venous contrast as well as the off-resonance artifact in SWI of the brain. Severe local field inhomogeneity can occur in brain tissue near tissue/bone interfaces at the orbitofrontal and lateral temporal regions as well as the frontal pole. The susceptibility difference induced by the B0 field change in venous blood is in the range of the size of a vein. In contrast, local field inhomogeneity can have a spatial extension of several centimeters.

The conventional HP filter applied to k-space, however, may not be effective in distinguishing the phase change due to venous blood or local field inhomogeneity. Residual background phase in the HP-filtered phase images can be large enough to introduce substantial off-resonance artifact in the phase mask in regions with severe field inhomogeneity. In the illustrative experiment, LFG measurements are used to estimate the severity of field inhomogeneity. In regions with small LFG values, the venous contrast in SWI is determined by both the phase and magnitude changes in veins, the same as that obtained by the conventional procedure. In regions with large LFG values, the venous contrast is shown to be more heavily determined by the magnitude images. By applying the Fermi weighting function to the HP-filtered phase images, the resulting phase mask is shown to have a value near 1.0 in regions with severe field inhomogeneity.

In addition to the Fermi function, other functions, such as $\exp(-\alpha LFG)$ and $\exp(-\alpha LFG^2)$, may reduce the off-resonance artifact. The Fermi weighting function has been demonstrated to have minimal adverse effect to the venous contrast in regions with mild field inhomogeneity, for example, because the Fermi function has a value near 1.0 for a wide range of LFG within R. The Fermi weighting function may also be less sensitive to the large-scale background field gradients caused by improper shimming. In comparison, other weighting functions may have more noticeable adverse effects to the overall venous contrast in regions with residual field gradient. Proper shimming of the B0 field may still be desirable, however, even with the use of Fermi weighting function. The linear shimming can be performed retrospectively during post-processing or prospectively on the scanner.

The effectiveness of LFG suppression in the phase mask may be determined by the size of the Fermi weighting function, R. A transition width W of one tenth of R (i.e., W~0.1R) may be adequate. The optimal selection of R may also depend on the size of the LP filter. With a small LP filter size, the off-resonance artifact may be more severe and may have a larger spatial extension. A smaller R value may be preferred in such case. On the other hand, a larger R value may be sufficient when a larger LP filter size is used.

The technique for direct 3D LFG mapping using a single 3D SPGR dataset without the need for phase unwrapping may provide robustness and substantially full automation. Unlike some other phase unwrapping algorithms in which human interactions are necessary, such as the placing of seeds for region growth, embodiments of the LFG technique may not require any human interaction and can be implemented with full automation.

Using mIP for the display of veins that have negative contrast may introduce signal loss in regions where the projection encounters air or bone. Noticeable dark shade can also occur in regions when the projection encounters cerebrospinal fluid due to its heavy T1 saturation. Removing the air cavity and scalp bone through volume segmentation can greatly reduce the signal loss in the peripheral regions of the brain in through-plane mIP display. Exclusion of the cerebrospinal fluid signal can also improve the contrast of some of the veins.

Brain volume segmentation may improve in-plane mIP display of MRV. The air region and bone structures may have to be excluded from mIP because their low intensity can obscure brain signal. In the illustrative experiment, for example, a 3D binary mask is generated by manual segmentation of the brain tissue using magnitude images. A binary erosion algorithm is used to further remove 2 or 3 layers of voxels on the edge of the brain on the 3D binary mask. A limitation of using the erosion algorithm may be ab adverse removal of some of the veins on the surface of the brain.

An accurate, automated, and robust segmentation algorithm may be desirable for high quality in-plane mIP display. Reduced venous contrast shown in the in-plane mIP, e.g., in FIG. 20, compared to that shown in the through-plane mIP, e.g., in FIG. 19b, may be a result of a lower through-plane resolution (1 mm) compared to the in-plane resolution (0.51 mm). Reducing slice thickness in data acquisition may be desirable for in-plane display. The increased projection length in the in-plane mIP may include a larger range of signal variation and, therefore, may also reduce the background signal and venous contrast in the mIP. The mIP in a selected region-of-interest may thus yield improved venous contrast.

It will be appreciated that components of the systems described herein can be rearranged or connected differently to perform similar or identical function, and steps of the methods described herein may be performed in alternate orders and still provide similar or identical results. Thus, having described several embodiments, it will be recognized by those of skill in the art that various modifications, alternative constructions, and equivalents may be used without departing from the spirit of the invention. Accordingly, the above description should not be taken as limiting the scope of the invention.

What is claimed is:

1. A system for susceptibility weighted magnetic resonance imaging of vasculature, comprising:
   a magnetic resonance device comprising:
   a pulse generator module configured to generate a multi-echo pulse sequence having a repetition time, wherein at least an excitation, a first echo, and second echo occur substantially during the repetition time; and
   a data acquirer module, communicatively coupled with the pulse generator module and configured to acquire magnetic resonance angiography data from the first echo, and magnetic resonance venography data from the second echo.

2. The system of claim 1, further comprising:
a post-processor module, communicatively coupled with the magnetic resonance device and configured to post-process at least one of the magnetic resonance angiography data or the magnetic resonance venography data.

3. The system of claim 2, further comprising:
a display generator module, communicatively coupled with the post-processor module and configured to display at least one of the magnetic resonance angiography data or the magnetic resonance venography data.

4. The system of claim 3,
wherein the display generator module is configured to display both the magnetic resonance angiography data and the magnetic resonance venography data at substantially the same time.

5. A method for susceptibility weighted magnetic resonance imaging of vasculature, comprising:
generating a multi-echo pulse sequence having a repetition time, wherein at least an excitation, a first echo, and second echo occur substantially during the repetition time;
acquiring magnetic resonance angiography data from the first echo; and
acquiring magnetic resonance venography data from the second echo.

6. The method of claim 5,
wherein the magnetic resonance angiography data and the magnetic resonance venography data are acquired at substantially the same time.

7. The method of claim 5, further comprising:
post-processing at least one of the magnetic resonance angiography data or the magnetic resonance venography data.

8. The method of claim 5, further comprising:
displaying both of the magnetic resonance angiography data and the magnetic resonance venography data at substantially the same time.

9. The method of claim 5, further comprising:
processing data from an unsampled portion of one echo using sampled data from another echo.

10. The method of claim 9,
wherein processing data from an unsampled portion of one echo using sampled data from another echo comprises:
sampling supplemental data from a portion of a third echo, the third echo being functionally related to the first echo; and
filling in an unsampled portion of the first echo using the supplemental data.

11. The method of claim 9,
wherein acquiring magnetic resonance angiography data from the first echo comprises representing the magnetic resonance angiography data as a sampled set of $k_y$ lines and an unsampled set of $k_y$ lines from each of the first echo and a third echo, and
wherein processing data from an unsampled portion of one echo using sampled data from another echo comprises using a portion of the sampled set of $k_y$ lines from the third echo to fill in a portion of the unsampled set of $k_y$ lines from the first echo.

12. The method of claim 9,
wherein acquiring magnetic resonance angiography data from the first echo comprises representing the magnetic resonance angiography data as a sampled set of $k_y$ lines and an unsampled set of $k_y$ lines from each of the first echo and a third echo,
wherein acquiring magnetic resonance venography data from the second echo comprises representing the magnetic resonance venography data as a sampled set of $k_y$ lines and an unsampled set of $k_y$ lines from each of the second echo and a fourth echo, and
wherein processing data from an unsampled portion of one echo using sampled data from another echo comprises:
using a portion of the sampled set of $k_y$ lines from the first echo to fill in a portion of the unsampled set of $k_y$ lines from the third echo;
using a portion of the sampled set of $k_y$ lines from the second echo to fill in a portion of the unsampled set of $k_y$ lines from the fourth echo;
using a portion of the sampled set of $k_y$ lines from the third echo to fill in a portion of the unsampled set of $k_y$ lines from the first echo; and
using a portion of the sampled set of $k_y$ lines from the fourth echo to fill in a portion of the unsampled set of $k_y$ lines from the second echo.

13. The method of claim 9,
wherein acquiring magnetic resonance angiography data from the first echo comprises representing the magnetic resonance angiography data as:
a first set of data including a sampled set of low frequency k-space data lying inside a first circular region defined by a first radius,
a second set of data including an unsampled set of k-space data lying outside a second circular region defined by a second radius, the second radius being larger than the first radius, and
a third set of data lying between the first circular region and the second circular region, the third set of data having a plurality of subsets, wherein each of the plurality of subsets is sampled during one of a plurality of echoes occurring during the multi-echo pulse sequence, and
wherein processing data from an unsampled portion of one echo using sampled data from another echo comprises:
recreating the third set of data using the plurality of subsets sampled during the plurality of echoes occurring during the multi-echo pulse sequence.

14. The method of claim 13,
wherein the third set of data has four subsets, each subset representing a quadrant of data, wherein each of the four subsets is sampled during one of four echoes occurring during the multi-echo pulse sequence.

15. A method for multi-slab data acquisition using susceptibility weighted magnetic resonance imaging, comprising:
generating a multi-echo pulse sequence comprising:
a first repetition time duration, beginning substantially upon directing a first excitation to excite a first slab of a target, wherein at least a first echo and a second echo occur substantially during the first repetition time duration; and
a second repetition time duration, beginning substantially upon directing a second excitation to excite a second slab of the target, wherein at least a third echo and a fourth echo occur substantially during the second repetition time duration;
acquiring magnetic resonance angiography data relating to the first slab from the first echo;
acquiring magnetic resonance venography data relating to the first slab from the second echo;
acquiring magnetic resonance angiography data relating to the second slab from the third echo;

acquiring magnetic resonance venography data relating to the second slab from the fourth echo; and wherein acquiring magnetic resonance angiography data from the second slab occurs prior to acquiring magnetic resonance venography data from the first slab.

16. The method of claim 15, wherein at least one of the first excitation signal or the second excitation signal comprises a radio-frequency excitation.

17. The method of claim 15, wherein:

the second repetition time duration begins substantially after the first echo and substantially before the second echo.

18. A method for post-processing magnetic resonance imaging data, comprising:

receiving magnetic resonance angiography and magnetic resonance venography data using a multi-echo pulse sequence having a repetition time and that at least an excitation, a first echo, and second echo occur substantially during the repetition time, wherein the magnetic resonance angiography data is acquired from the first echo so that when processed an image of arterial vasculature is generated, and wherein the magnetic resonance venography data is acquired from the second echo so that when processed an image of venous vasculature is generated;

weighting the magnetic resonance angiography and magnetic resonance venography data using a susceptibility weighting algorithm;

filtering the magnetic resonance angiography and magnetic resonance venography data using a filtering algorithm; and projecting the magnetic resonance angiography and magnetic resonance venography data using a projection algorithm.

19. The system of claim 1, wherein the data acquirer module is configured to acquire magnetic resonance angiography data from the first echo and a subsequent echo.

20. The system of claim 1, wherein the data acquirer module is configured to acquire magnetic resonance venography data from the second echo and a subsequent echo.

* * * * *

UNITED STATES PATENT AND TRADEMARK OFFICE
CERTIFICATE OF CORRECTION

PATENT NO. : 8,674,691 B2  
APPLICATION NO. : 12/863729  
DATED : March 18, 2014  
INVENTOR(S) : Yiping Du Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 665 days.

Signed and Sealed this

Twenty-ninth Day of September, 2015

Michelle K. Lee
*Director of the United States Patent and Trademark Office*